United States Patent
Wei

(10) Patent No.: US 9,548,408 B2
(45) Date of Patent: Jan. 17, 2017

(54) TUNNELING BARRIER INFRARED DETECTOR DEVICES

(71) Applicant: L-3 Communications Cincinnati Electronics Corporation, Mason, OH (US)

(72) Inventor: Yajun Wei, Cincinnati, OH (US)

(73) Assignee: L-3 Communications Cincinnati Electronics Corporation, Mason, OH (US)

( * ) Notice: Subject to any disclaimer, the term of this patent is extended or adjusted under 35 U.S.C. 154(b) by 0 days.

(21) Appl. No.: 14/686,489

(22) Filed: Apr. 14, 2015

(65) Prior Publication Data
US 2015/0295108 A1 Oct. 15, 2015

Related U.S. Application Data

(60) Provisional application No. 61/979,754, filed on Apr. 15, 2014.

(51) Int. Cl.
*H01L 31/0352* (2006.01)
*H01L 31/101* (2006.01)
(Continued)

(52) U.S. Cl.
CPC . *H01L 31/035236* (2013.01); *H01L 31/03046* (2013.01); *H01L 31/035209* (2013.01);
(Continued)

(58) Field of Classification Search
CPC ............... H01L 31/035236; H01L 31/03046; H01L 31/1075; H01L 33/06; H01L 31/035209; H01L 31/101; H01L 31/109; Y02E 10/544
See application file for complete search history.

(56) References Cited

U.S. PATENT DOCUMENTS

| 4,821,082 A * | 4/1989 | Frank ............... H01L 29/7371 257/198 |
| 5,399,880 A | 3/1995 | Chand |

(Continued)

OTHER PUBLICATIONS

Yi et al. "Bandgap and Band Offsets DBetermination of semiconductor Heterostructures using Three-terminal Ballistic Carrier Spectroscopy." Schhol of engineering and applied sciences, Harvard University, Cambridge, Massachusetts, Apr. 15, 2009.*

(Continued)

*Primary Examiner* — Mohsen Ahmadi
(74) *Attorney, Agent, or Firm* — Dinsmore & Shohl, LLP

(57) ABSTRACT

Embodiments of the present disclosure are directed to infrared detector devices incorporating a tunneling structure. In one embodiment, an infrared detector device includes a first contact layer, an absorber layer adjacent to the first contact layer, and a tunneling structure including a barrier layer adjacent to the absorber layer and a second contact layer adjacent to the barrier layer. The barrier layer has a tailored valence band offset such that a valence band offset of the barrier layer at the interface between the absorber layer and the barrier layer is substantially aligned with the valence band offset of the absorber layer, and the valence band offset of the barrier layer at the interface between the barrier layer and the second contact layer is above a conduction band offset of the second contact layer.

12 Claims, 19 Drawing Sheets

(51) Int. Cl.
   *H01L 31/109* (2006.01)
   *H01L 31/0304* (2006.01)
(52) U.S. Cl.
   CPC .......... *H01L 31/101* (2013.01); *H01L 31/109* (2013.01); *H01L 31/1013* (2013.01); *Y02E 10/544* (2013.01)

(56) References Cited

U.S. PATENT DOCUMENTS

| | | | |
|---|---|---|---|
| 6,670,653 B1* | 12/2003 | Micovic | H01L 29/155 257/15 |
| 8,093,559 B1 | 1/2012 | Rajavel | |
| 8,217,480 B2 | 7/2012 | Ting et al. | |
| 8,338,200 B2* | 12/2012 | Forrai | B82Y 20/00 257/103 |
| 8,368,051 B2 | 2/2013 | Ting et al. | |
| 8,723,161 B1 | 5/2014 | Klem et al. | |
| 8,846,432 B2* | 9/2014 | Jones | H01L 31/03523 257/E31.11 |
| 2003/0089958 A1* | 5/2003 | Gutierrez-Aitken | H01L 31/03046 257/458 |
| 2006/0012000 A1* | 1/2006 | Estes | B82Y 10/00 257/425 |
| 2009/0224229 A1* | 9/2009 | Razeghi | H01L 31/0304 257/21 |
| 2010/0072514 A1* | 3/2010 | Ting | H01L 31/0304 257/184 |
| 2010/0155777 A1* | 6/2010 | Hill | H01L 31/03046 257/184 |
| 2010/0230720 A1* | 9/2010 | Wicks | B82Y 20/00 257/188 |
| 2012/0145996 A1* | 6/2012 | Ting | B82Y 20/00 257/21 |
| 2012/0199184 A1* | 8/2012 | Nie | H01L 27/142 136/255 |
| 2012/0217475 A1* | 8/2012 | Leavitt | B82Y 20/00 257/14 |
| 2013/0062593 A1 | 3/2013 | Jones et al. | |
| 2016/0071994 A1* | 3/2016 | Bosco | H01L 31/02246 136/252 |

OTHER PUBLICATIONS

Vurgaftman et al, "Graded Band Gap for Dark-Current Suppression in Long Wave Infrared W-Structured Type-II Superlattice Photodiodes," Applied Physics Letters, 10.1063/1.2356697 (2006).
Chang et al, "Type II Superlattice Infrared Photodetector," IBM TBD 8:270-271 (Jan. 2005).
Ohno et al, "Optoelectronic Devices Based on Type II Polytype Tunnel Heterostructures," Applied Physics Letters, doi: 10.1063/1.106726 (1992).

* cited by examiner

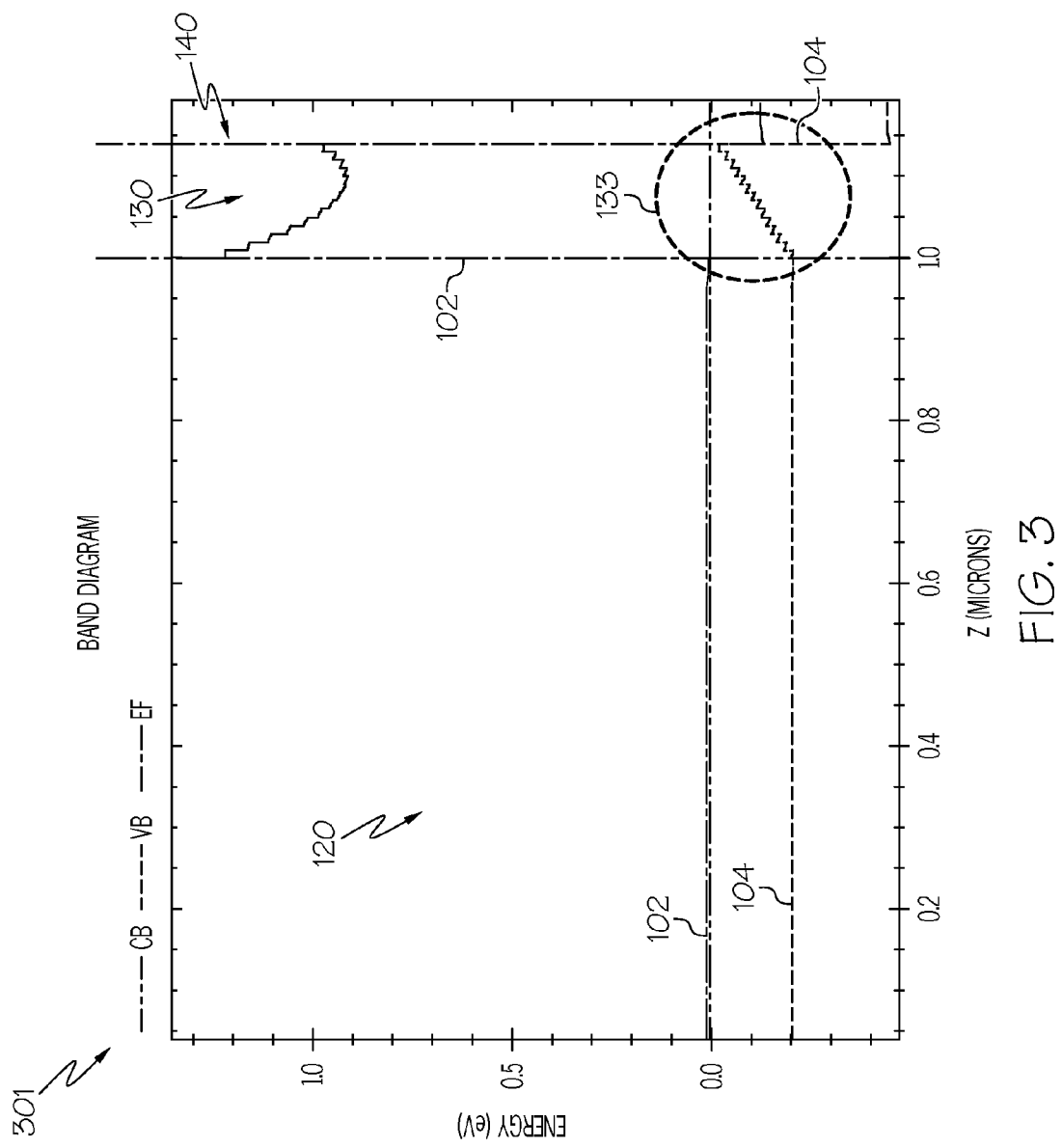

TUNNELING BARRIER INFRARED DETECTOR DEVICES

CROSS-REFERENCE TO RELATED APPLICATIONS

This application claims the benefit of U.S. Provisional Application No. 61/979,745, filed on Apr. 15, 2014, the contents of which are incorporated by reference in their entirety

BACKGROUND

Field

The present specification generally relates to infrared detector devices and, more particularly, to tunneling barrier infrared detector devices and structures for reducing dark current, lowering bias voltage, and increasing operating temperature for infrared detectors such as focal plane arrays.

Technical Background

The nBn device structure has been used to improve the operating temperature of photoconductive infrared detectors by blocking the flow of electrons. The nBn device structure generally includes an n-type absorber layer, a barrier layer to block majority carriers, and an n-type contact layer. Such nBn devices can be used to improve the operating temperature of an infrared focal plane arrays (FPA). FPA devices using the nBn device structure require significant bias to turn on the photocurrent, while the dark current density increases at the same time. To increase the operating temperature further, it is necessary to further reduce the dark current and lower the bias voltage required to turn on the photocurrent. If a zero bias photoresponse can be achieved, it will provide more room for FPA biasing optimizations and thus better imaging quality.

Accordingly, a need exists for alternative infrared detector devices with lower dark current, lower required bias voltages, and increased operating temperature.

SUMMARY

These and additional features provided by the embodiments described herein will be more fully understood in view of the following detailed description, in conjunction with the drawings.

Embodiments described herein are directed to tunneling barrier infrared detector ("TBIRD") structures. In some embodiments, a TBIRD architecture allows minority carrier (holes) to tunnel through the barrier structure into the conduction band of the contacting layer and get collected. In other embodiments, a Fast TBIRD architecture is particularly suited for p-type absorption materials where the minority electrons can tunnel through the "barrier" layers in the device interior, while on the surface, due to the natural oxidization of the "barrier" layers, current flow is blocked. This resolves the passivation issue present in devices utilizing p-type absorbers, where exposed sidewall surface is inverted to n-type.

The TBIRD structures described herein provide a universal solution for infrared detectors with a cutoff wavelength ranging from short-wave infrared ("SWIR") to very long-wave infrared ("VLWIR") and beyond.

In one embodiment, an infrared detector device includes a first contact layer, an absorber layer adjacent to the first contact layer, and a tunneling structure including a barrier layer adjacent to the absorber layer and a second contact layer adjacent to the barrier layer. The barrier layer has a tailored valence band offset such that a valence band offset of the barrier layer at the interface between the absorber layer and the barrier layer is substantially aligned with the valence band offset of the absorber layer, and the valence band offset of the barrier layer at the interface between the barrier layer and the second contact layer is above a conduction band offset of the second contact layer.

In another embodiment, an infrared detector device includes a first contact layer, an absorber layer adjacent to the first contact layer, wherein the absorber layer is doped p-type, a first barrier layer adjacent to the absorber layer, an n-type layer adjacent to the first barrier layer, a second barrier layer adjacent to the n-type layer, and a second contact layer adjacent to the second barrier layer. A bandgap of the n-type layer is greater than a bandgap of the absorber layer. A valence band offset of the first barrier layer at an interface between the first barrier layer and the n-type layer is above a conduction band offset of the n-type layer.

In yet another embodiment, an infrared detector device includes a first contact layer, an absorber layer adjacent to the first contact layer, wherein the absorber layer is doped p-type, a hole barrier layer adjacent to the absorber layer, a first barrier layer adjacent to the hole barrier layer, a second barrier layer adjacent to the first barrier layer, and a second contact layer adjacent to the second barrier layer. A bandgap of the hole barrier layer is greater than a bandgap of the absorber layer. The hole barrier layer includes a p-n junction. A valence band offset of the first barrier layer is above a conduction band offset of the hole barrier layer at an interface between the hole barrier layer and the first barrier layer.

In yet another embodiment, an infrared detector device includes a first contact layer, an absorber layer adjacent to the first contact layer, wherein the absorber layer is doped p-type, a hole barrier layer adjacent to the absorber layer, an n++ layer adjacent the hole barrier layer, wherein a thickness of the n++ layer is less than a thickness of the hole barrier layer, a barrier layer adjacent to the n++ layer, wherein the barrier layer is doped p++, and a second contact layer adjacent to the barrier layer, wherein the second contact layer is doped p+. A bandgap of the hole barrier layer is greater than a bandgap of the absorber layer. The hole barrier layer includes a p-n junction.

In yet another embodiment, a dual-band infrared detector device includes a first absorber layer, wherein the first absorber layer is capable of absorbing radiation in a first wavelength range, a first barrier layer adjacent to the first absorber layer, a second barrier layer adjacent to the first barrier layer, and a second absorber layer, wherein the second absorber layer is capable of absorbing radiation in a second wavelength range. Wavelengths within the second wavelength range are shorter than wavelengths in the first wavelength range. The first barrier layer, the second barrier layer, and the second absorber layer form a tunneling structure; A valence band offset of the second barrier layer at an interface between the second barrier layer and the second absorber layer is above a conduction band offset of the second absorber layer. Under zero bias or negative bias wherein a positive potential is present at the first absorber layer with respect to the second absorber layer, the dual-band infrared detector device provides a long-wave response. Under positive bias wherein a positive potential is present at the second absorber layer with respect to the first absorber layer, the dual-band infrared detector device provides a mid-wave response.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

FIG. 3 is a graphic illustration of a band diagram for a simulation of an example mid-wave infrared TBIRD device having a graded barrier layer according to one or more embodiments described and illustrated herein;

DETAILED DESCRIPTION

Embodiments of the present disclosure are directed to tunneling barrier infrared detector ("TBIRD") devices and structures. Such TBIRD structures may be incorporated into infrared applications, such as focal plane arrays. Embodiments described herein are generically applicable to infrared detector devices regardless of wavelength regime, e.g., short-wave infrared ("SWIR"), mid-wave infrared ("MWIR"), long-wave infrared ("LWIR"), very long-wave infrared ("VLWIR"), far infrared ("FIR"), and the like, to reduce the dark current level and provide close to zero bias optical turn on.

More specifically, in some embodiments a TBIRD architecture provides a tunneling structure that allows minority carrier (holes) to tunnel through a barrier layer into the conduction band of the contacting layer and get collected. As described in more detail below, the tunneling structure may be provided by a dedicated tunneling layer adjacent to a barrier layer, or may be incorporated into the barrier layer directed by used of a graded material.

In other embodiments, a Fast TBIRD architecture is used in conjunction with p-type absorption materials where the minority electrons are able to tunnel through the one or more barrier layers in the device interior. Current flow is blocked on the surface of the device due to the natural oxidization of the barrier layers. This resolves the passivation issue present in devices utilizing p-type absorbers, especially those using Ga-free superlattice structures ("SLS").

The TBIRD structures described herein provide a universal solution for infrared detectors with a cutoff wavelength ranging from SWIR to FIR.

Figure 1:
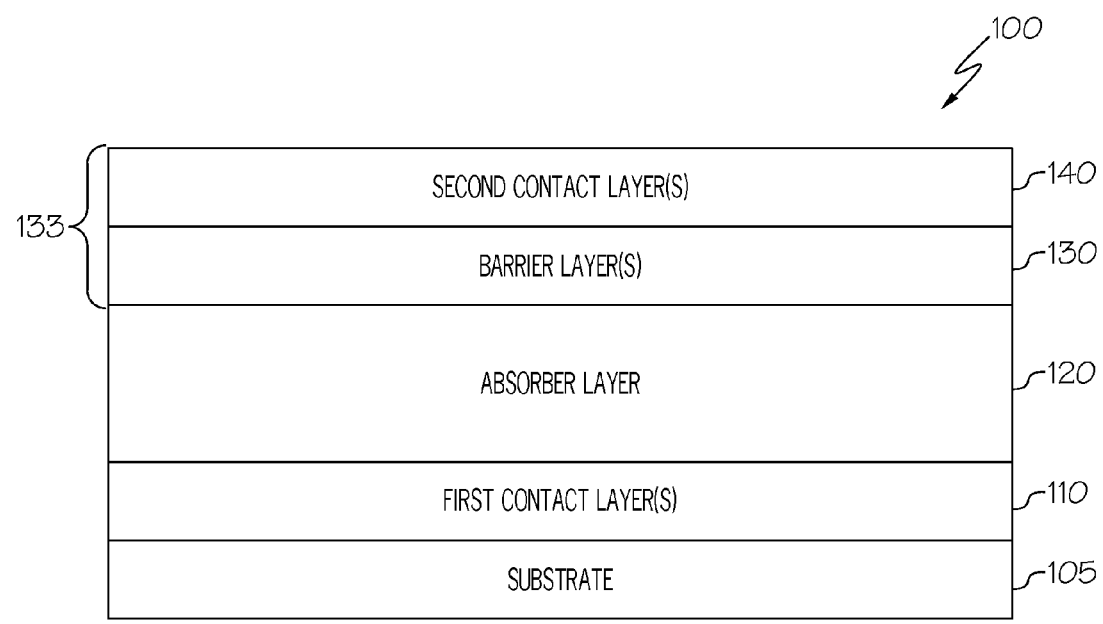
FIG. 1 is a schematic illustration of an exemplary tunneling barrier infrared detector ("TBIRD") device according to one or more embodiments described and illustrated herein.

Referring to FIG. 1, an example TBIRD structure 100 is schematically illustrated. The example TBIRD structure generally comprises a substrate 105, one or more first contact layers 110 (i.e., one or more first collector layers) disposed on the substrate 105, an absorber layer 120 disposed on the one or more first contact layers 110, one or more barrier layers 130 disposed on the absorber layer 120, and one or more second contact layers 140 (i.e., one or more collector layers) disposed on the one or more barrier layers 130. As described in more detail below, the one or more barrier layers 130 and one or more second contact layers 140 form a tunneling structure 133.

In the example TBIRD structure depicted in FIG. 1, the first contact layer 110 is a doped n-type semiconductor material, while the second contact layer 140 is a doped p-type material. The absorber layer 120 is an n-doped semiconductor material capable of absorbing photons in a desired wavelength range. The absorber layer 120 may be fabricated from materials capable of absorbing wavelengths in any infrared wavelength range, such as near-infrared, short-wave infrared ("SWIR"), mid-wave infrared ("MWIR"), long-wave infrared ("LWIR"), very long-wave infrared ("VLWIR"), and far infrared. As non-limiting examples, the absorber layer 120 may comprise an n-doped InAs/InAsSb SLS, InAs/Ga(In)Sb SLS, a digital alloy (e.g., InAsSb absorber with GaAs strain balancer), or bulk absorber (e.g., bulk InAsSb), and the barrier layer 130 may comprise AlAsSb, AlGaAsSb, AlSb/InAs SLS, or AlSb/InAs/GaSb SLS etc. In some embodiments, the contact layer 140 is n-doped InAsSb, InAs/InAsSb SLS, or InAs/Ga(In)Sb SLS. The substrate 105 may be fabricated from any suitable base substrate, such as GaSb. Although examples are given for materials grown on GaSb substrate, similar device structures may be formed on other types of substrates, such as InAs, InP, GaAs, and the like.

Figure 2A:
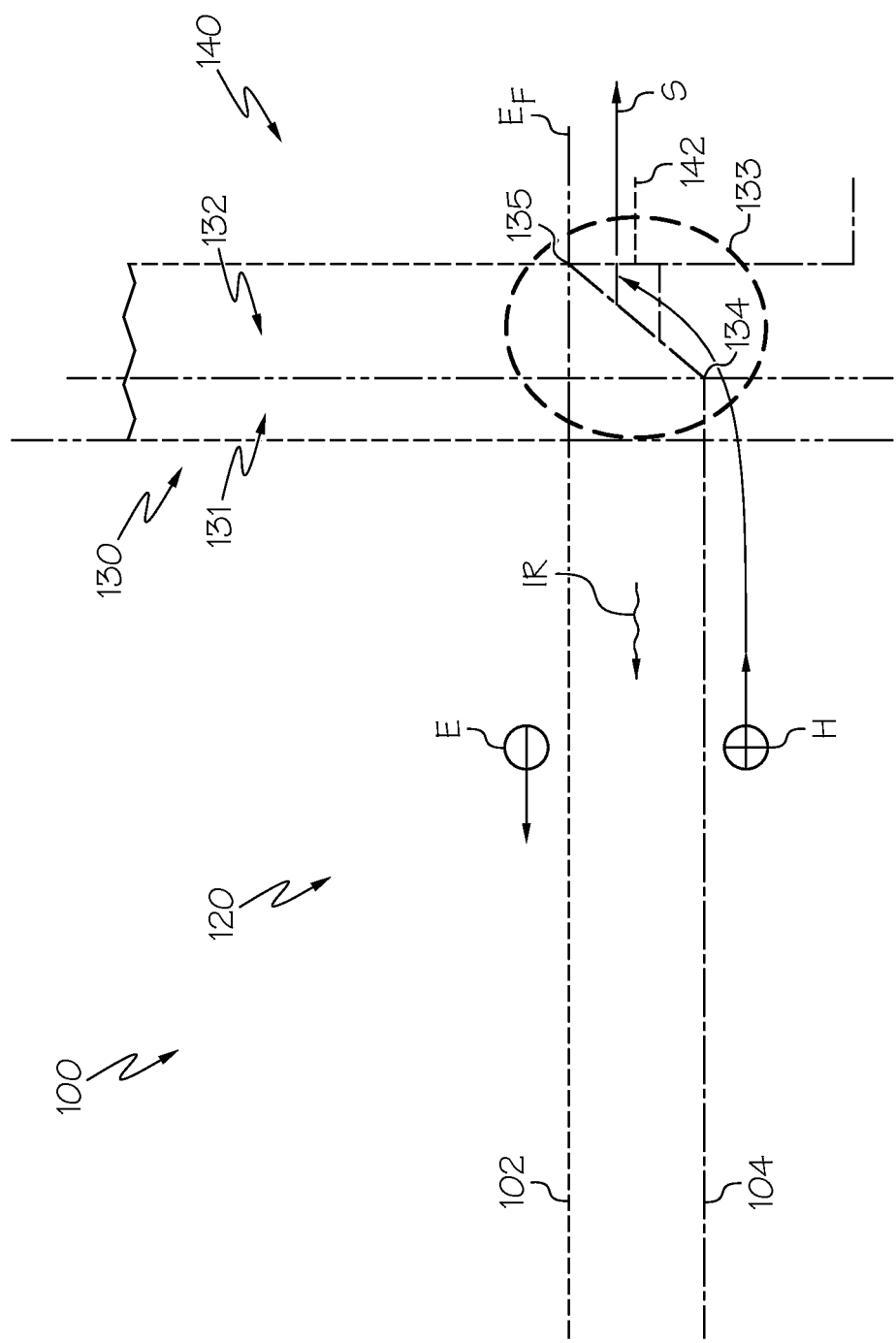
FIG. 2A is a graphic illustration of a band diagram for an example TBIRD device having a triangular tunneling structure according to one or more embodiments described and illustrated herein.
Figure 2B:
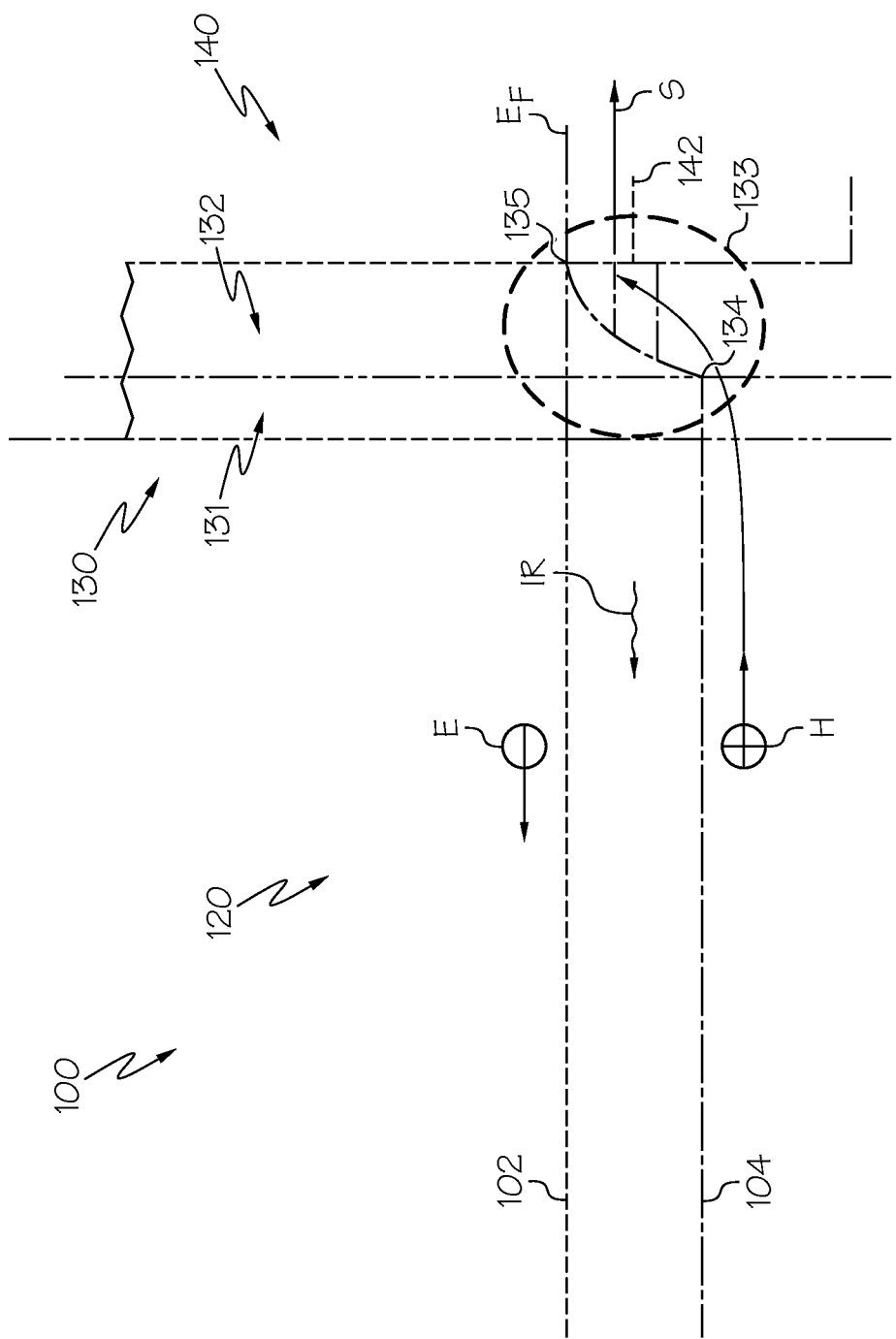
FIG. 2B is a graphic illustration of a band diagram for an example TBIRD device having a parabolic tunneling structure according to one or more embodiments described and illustrated herein.
Figure 2C:
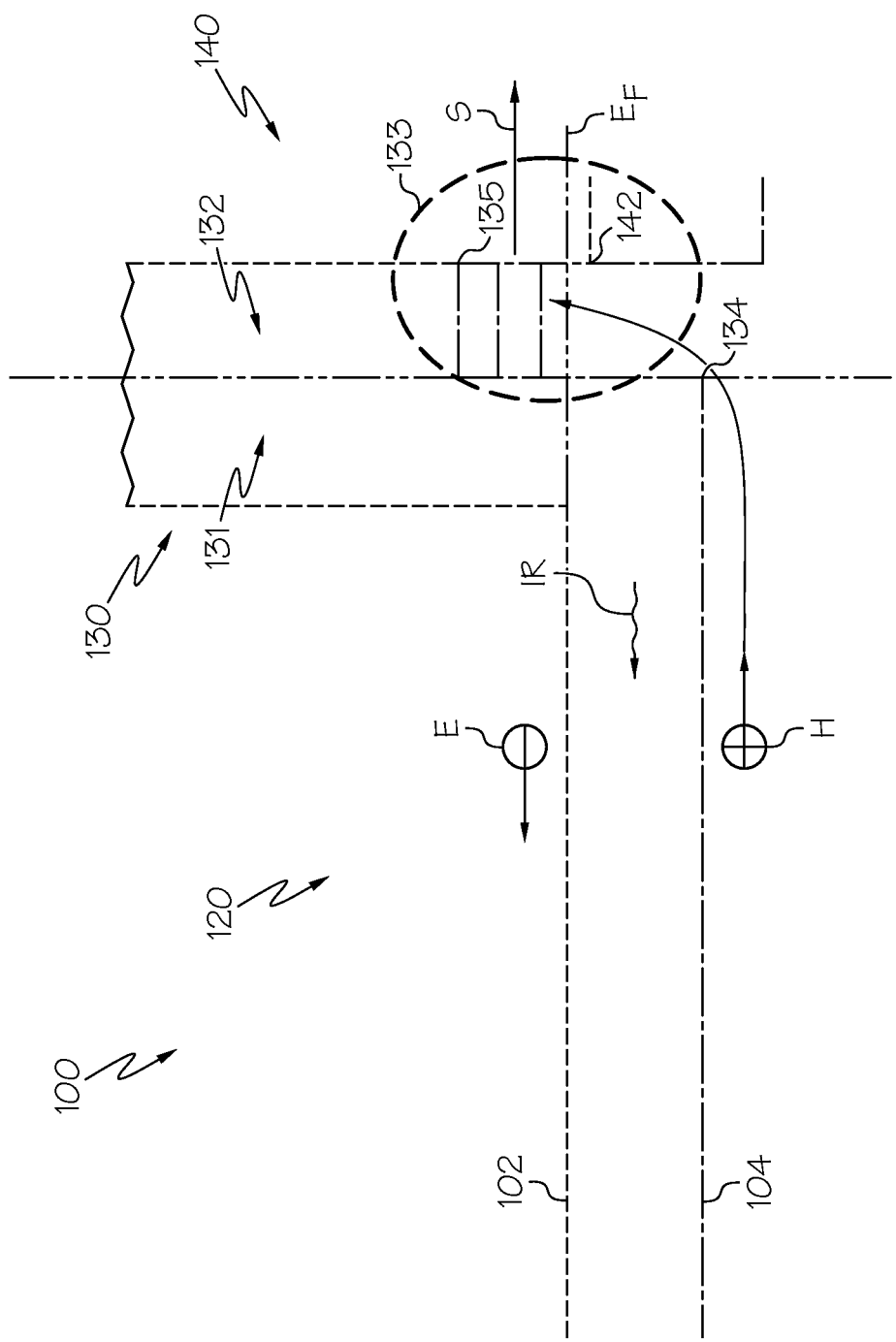
FIG. 2C is a graphic illustration of a band diagram for an example TBIRD device having a rectangular tunneling structure according to one or more embodiments described and illustrated herein.

FIGS. 2A-2C depict band diagrams for various implementations of the TBIRD structure 100 depicted in FIG. 1. Line $E_F$ represents the Fermi energy, while line 102 is the conduction band and line 104 is the valence band of the TBIRD structure 100. FIGS. 2A-2C depict an absorber layer 120, barrier layers 130 comprising a first barrier layer 131 and a second barrier layer 132, and a second contact layer 140. It is noted that the substrate layer and the first contact layer are not depicted in FIGS. 2A-16 for ease of illustration. Although FIGS. 2A-2C illustrate a first barrier layer 131 and a second barrier layer 132, in other embodiments only a single barrier layer 130 is provided (e.g., a graded barrier layer).

As shown in FIGS. 2A-2C, the barrier layer(s) 130 and the second contact layer(s) 140 define a tunneling structure 133 that is tailored such that the valence band offset ("VBO") at the interface between the second barrier layer 132 and the contact layer 140 is above the conduction band offset ("CBO") 142 of the contact layer 140 to provide a tunneling junction interface. Therefore, the base energy level within the hole quantum well defined by the tunneling structure 133 is above the CBO 142 at the interface between the second barrier layer 132 and the second contact layer 140. FIGS. 2A-2C illustrate a tunneling structure 133 providing a quantum well for holes having a variety of shapes. Although the shape of the tunneling structure 133 providing the potential well for holes at the tunneling junction interface is illustrated as linear or triangular in FIG. 2A, as parabolic in FIG. 2B, or rectangular (i.e., discrete) as in FIG. 2C, it may take any shape as long as the lowest hole energy level (i.e., the valence band 104 at point 135) is above the CBO 142 of the contact layer 140 (i.e., the conduction band 102 at point 142). The VBO 134 of the first barrier layer 131 is substantially aligned with the VBO of the absorber layer 120 at the interface between the first barrier layer 131 and the absorber layer 120.

Once an incident photon generates an electron-hole pair in the absorber layer 120, the hole first diffuses to the barrier layer(s) 130. Due to the potential drop within the barrier layer 130, the holes drop to the lowest available hole states within the quantum well formed within the barrier layer(s) 130 (e.g., second barrier layer 132), and recombine with electrons from the contact layer 140 at the interface between the barrier layer(s) 130 (e.g., second barrier layer 132) and the contact layer 140. The charge neutrality requirement ensures that there will be equal number of electrons from contact metal flowing in for compensation. Thus, the signal is propagated out of the device.

As an example and not a limitation, for an absorber material (e.g., MWIR, LWIR, or VLWIR (on GaSb substrates)), the contact layer 140 material may be $InAs_{0.9107}Sb_{0.0893}$ lattice-matched to GaSb. As $InAs_{0.9107}Sb_{0.0893}$ has a cutoff wavelength of <4.0 µm below 150K, it would not affect the absorption near the band edge of the absorber layer 120. The validity of the TBIRD structure is applicable to SLS with arbitrary cutoff from SWIR to VLWIR and is universal. Once the minority carrier is collected in the InAsSb contact layer 140, the signal current flow is carried by electrons, instead of holes. This may make the collection efficiency very high due to orders of magnitude higher electron mobility than the holes. In addition, disadvantages of Ohmic contact to the valence band hole carriers while the material is n-type is avoided with the proposed tunneling structure.

An example embodiment of a MWIR TBIRD device design illustrated by a simulation band diagram 301 is shown in FIG. 3. The illustrated embodiment uses a MWIR absorber material for layer 120, a graded $(GaSb)_x(AlAs_{0.0835}Sb_{0.9165})_{1-x}$ barrier 130 and a second contact layer 140 of $(GaSb)_y(InAs_{0.9107}Sb_{0.0893})_{1-y}$. The composition x within the barrier layer 130 is graded, or varied with layer thickness, such that under zero bias, the VBO within the barrier is linearly dependent on the layer thickness. In alternative embodiments, the barrier layer 130 may be made of a graded barrier superlattice material as well, such as AlAsSb/GaSb SLS with varying layer thickness to achieve better controllability. The contact layer 140 may be n-doped in the $10^{17}$~$10^{18}$ cm$^{-3}$ range.

As shown in FIG. 3, the tunneling structure 133 defined by the barrier layer 130 and the second contact layer 140 is triangular in shape. The VBO at the interface between the barrier layer 130 and the second contact layer 140 is above the CBO, as shown by lines 104 and 102. The tunneling structure 133 therefore provides a quantum well for holes and allows holes to "tunnel through" the barrier layer 130.

Figure 4:
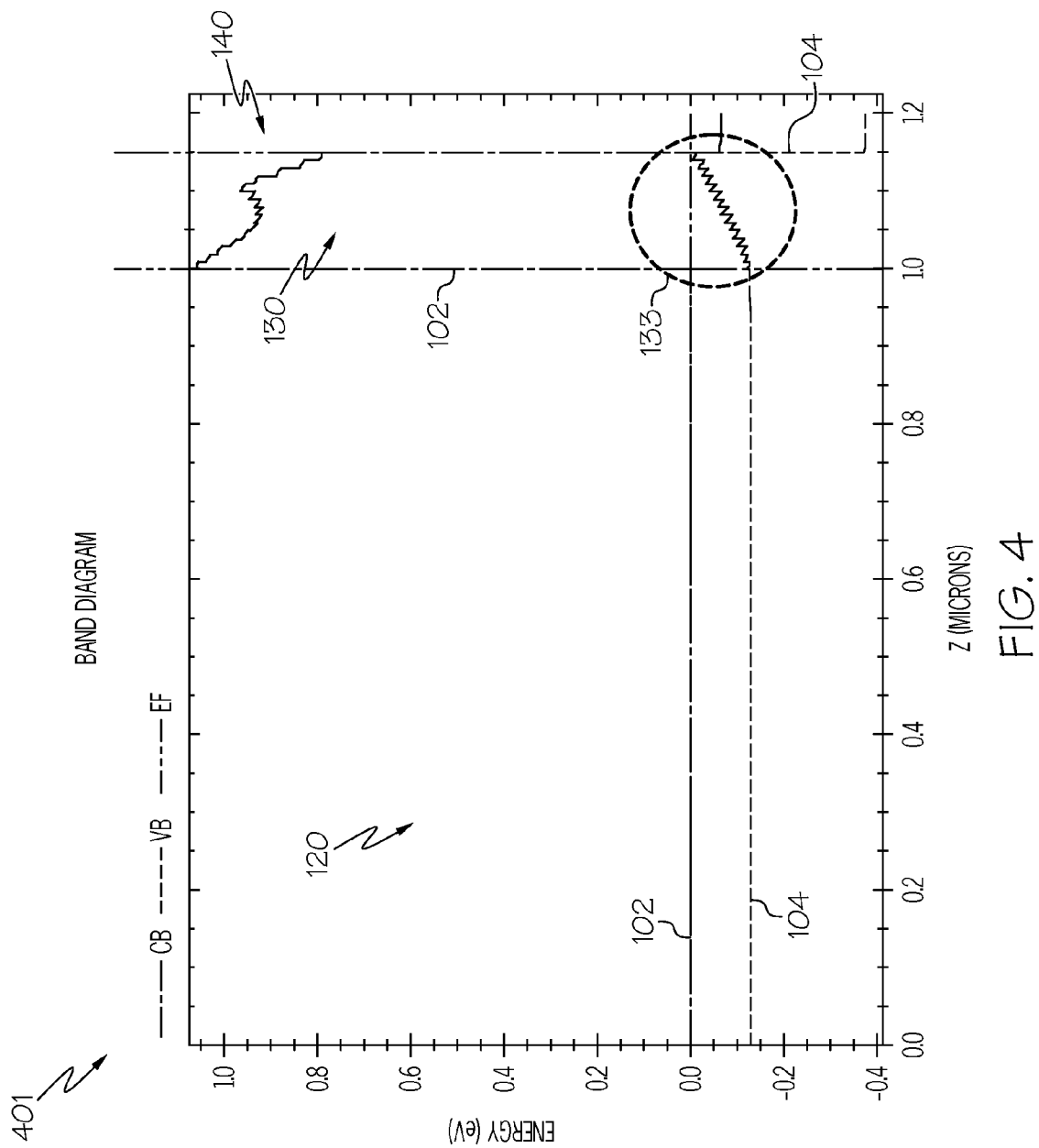
FIG. 4 is a graphic illustration of a band diagram for a simulation of an example long-wave infrared TBIRD device having a graded barrier layer according to one or more embodiments described and illustrated herein.

An example embodiment of a LWIR TBIRD device design illustrated by a simulation band diagram 401 is shown in FIG. 4. The absorber layer 120 is fabricated from a LWIR material. The barrier layer 130 is fabricated from a material similar to the barrier layer 130 of FIG. 3 such that the VBO of the barrier layer is substantially aligned with VBO of the absorber layer 120 on at the interface between the absorber layer 120 and the barrier layer 130, as shown by line 104. The contact layer 140 may be $(GaSb)_x(InAs_{0.9107}Sb_{0.0893})_{1-x}$ doped n-type as described above with respect to FIG. 3.

As shown in FIG. 4, the tunneling structure 133 within the barrier layer 130 is triangular in shape. The VBO of the barrier layer 130 at the interface between the barrier layer 130 and the second contact layer 140 is above the CBO, as shown by lines 104 and 102. The tunneling structure 133 therefore provides a quantum well for holes and allows holes to "tunnel through" the barrier layer 130.

Figure 5:
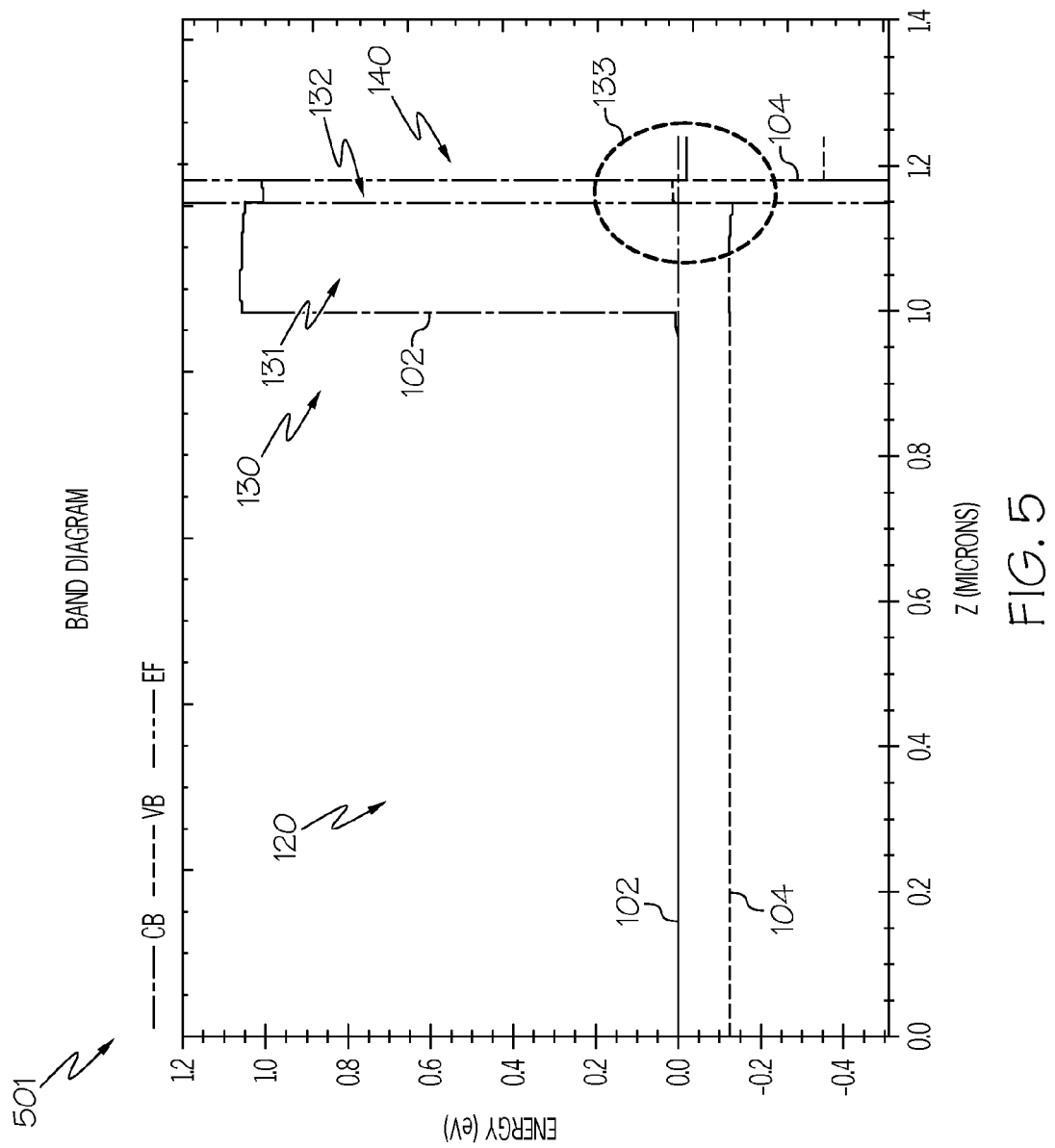
FIG. 5 is a graphic illustration of a band diagram for a simulation of an example long-wave infrared TBIRD device having a rectangular hole well according to one or more embodiments described and illustrated herein.

An example embodiment of a LWIR TBIRD device design illustrated by a simulation band diagram 501 is shown in FIG. 5. The structure of the simulated device is similar to the TBIRD device depicted in FIG. 1, where the barrier layer comprises a first barrier layer 131 and a second barrier layer 132. This example device design has a first barrier layer 131 fabricated from $(GaSb)_x(AlAs_{0.08}Sb_{0.92})_{1-x}$ lattice matched to GaSb, with x value chosen such that the VBO of the first barrier layer 131 is lined up with that of the absorber layer 120. In this embodiment, a second barrier layer 132 fabricated from a thin layer of $(GaSb)_y$ $(AlAs_{0.08}Sb_{0.92})_{1-y}$ (y>x) forming a quantum well for the holes prior to the contacting collector material of the contact layer 140. In the illustrated embodiment, the second barrier layer 132 is p+ doped to the order of $10^{18}$ cm$^{-3}$ for a well thickness of 300 Å. The contact layer 140 is fabricated from $InAs_{0.9107}Sb_{0.0893}$ that is lattice matched to GaSb. The contact layer 140 may be doped to achieve proper band alignment.

As a general rule, as used herein, p–/n– doping levels are on the order of $10^{-16}$ cm$^{-3}$ or lower, p/n doping levels are on the order of $10^{16} \sim 10^{17}$ cm$^{-3}$, p+/n+ doping levels are on the order of $10^{18}$ cm$^{-3}$, and p++/n++ doping levels are on the order of $10^{19}$ cm$^{-3}$ or beyond.

In the simulation band diagram 501 depicted in FIG. 5, the tunneling structure 133 formed by the second barrier layer 132 and the second contact layer 140 is configured as a step-wise transition from a first VBO of the first barrier layer 131 to a second VBO of the second barrier layer 132 at the interface between the first barrier layer 131 and the second barrier layer 132. The second VBO is above the CBO of the second contact layer 140 at the interface between the second barrier layer 132 and the contact layer 140, thereby providing the hole tunneling function described above.

Figure 6:
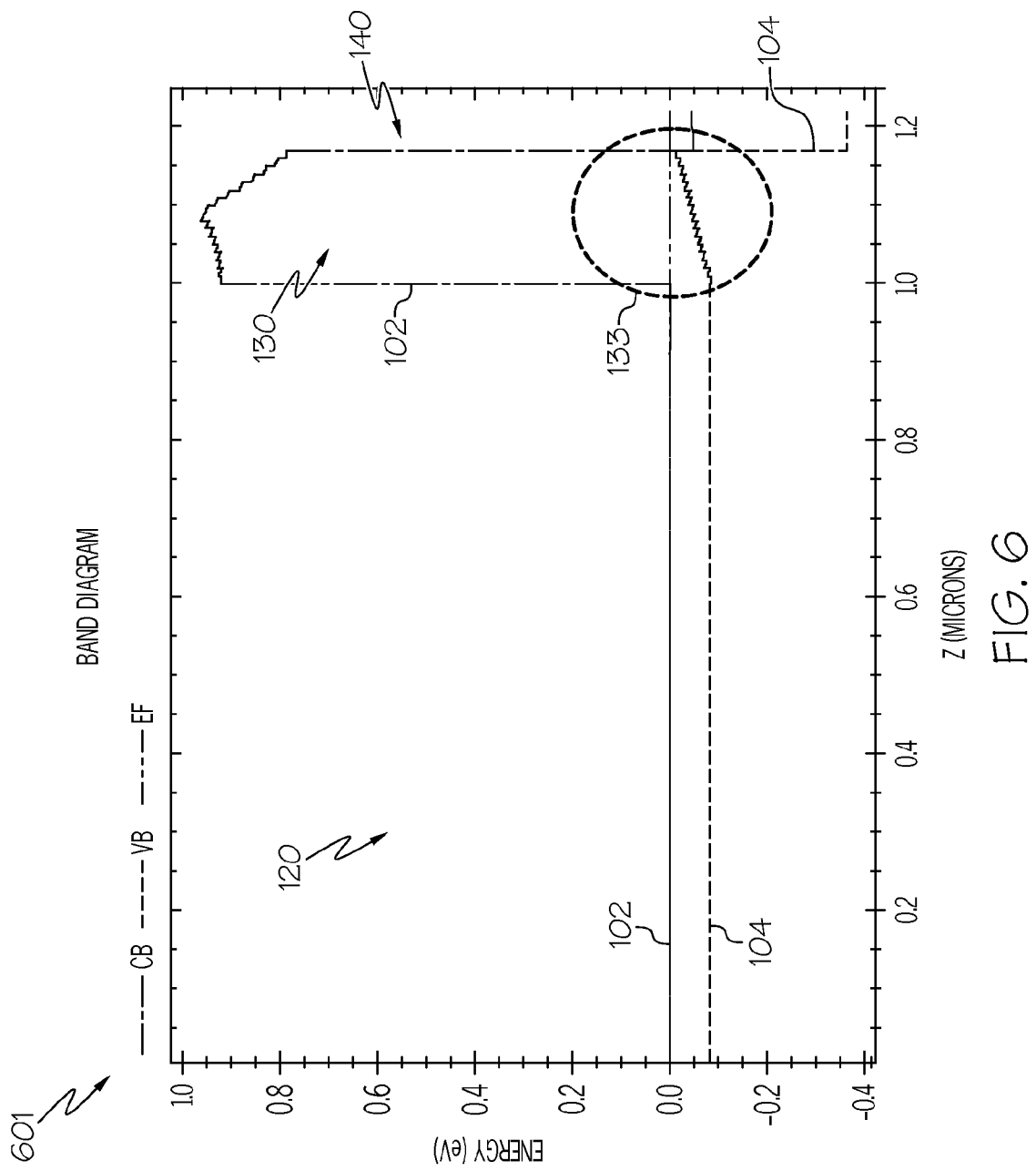
FIG. 6 is a graphic illustration of a band diagram for a simulation of an example very long-wave infrared TBIRD device having a graded barrier layer according to one or more embodiments described and illustrated herein.

Another example embodiment of a VLWIR TBIRD device design is illustrated by the simulation band diagram 601 of FIG. 6. The absorber layer 120 is fabricated from a VLWIR material. The barrier layer 130 is fabricated from the same type of material as described above with respect to FIG. 3. The barrier layer 130 is configured such that the VBO lines up with that of the absorber layer 120 at the interface between the absorber layer 120 and the barrier layer 130. The contact layer 140 of the example device illustrated by FIG. 6 is fabricated from $(GaSb)_{0.325}$ $(InAs_{0.91}Sb_{0.09})_{0.675}$. As shown by lines 102 and 104 in FIG. 6, the VBO of the barrier layer 130 is above the CBO at the interface between the barrier layer 130 and the contact layer 140.

Figure 7:
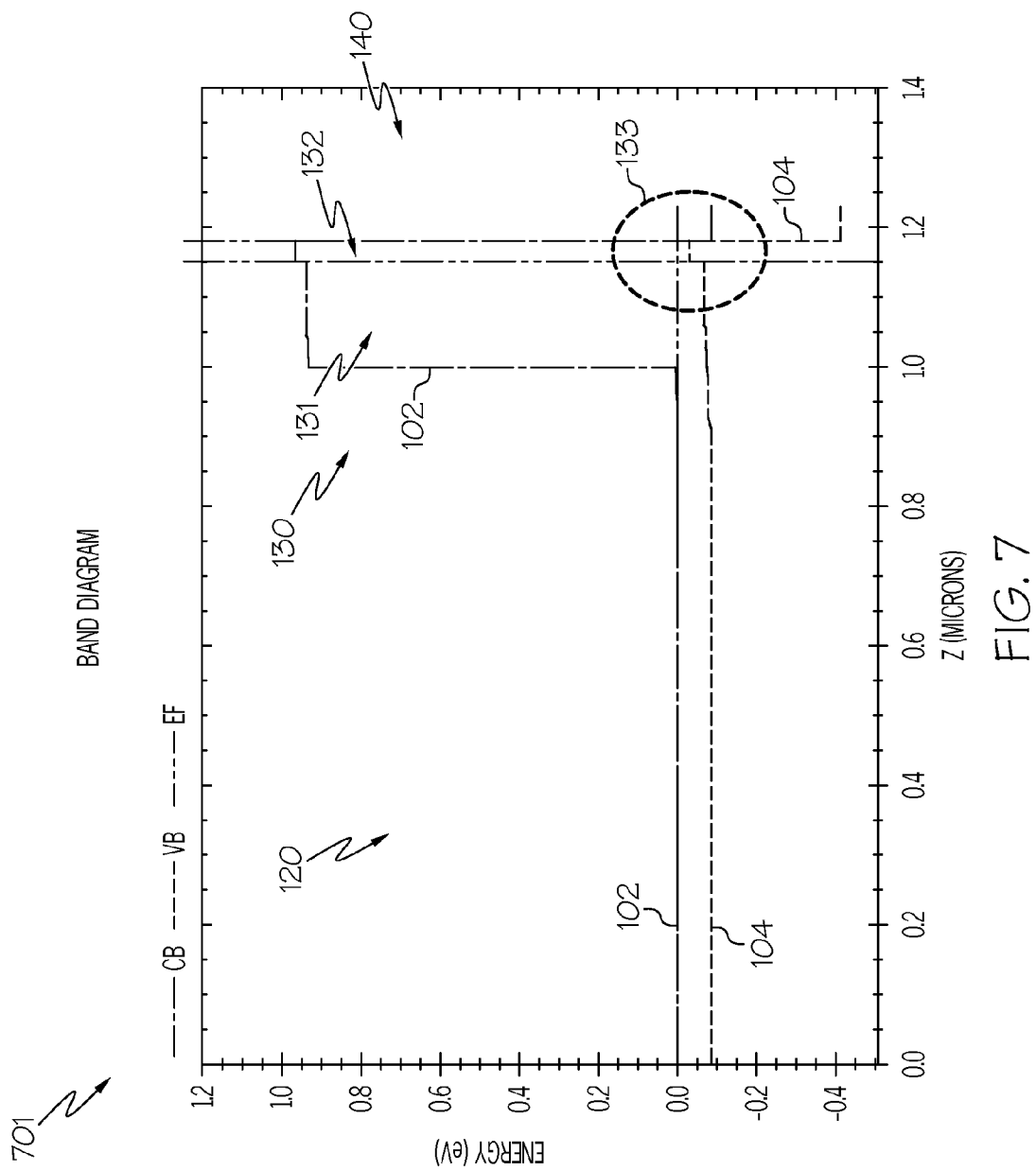
FIG. 7 is a graphic illustration of a band diagram for a simulation of an example very long-wave infrared TBIRD device having a rectangular hole well according to one or more embodiments described and illustrated herein.

Another example embodiment of a VLWIR TBIRD device design is illustrated by the simulation band diagram 701 of FIG. 7. Instead of a graded the barrier layer, the barrier layer 130 comprises a first barrier layer 131 and a thin second barrier layer 132 of $(GaSb)_y(AlAs_{0.08}Sb_{0.92})_{1-y}$ that in part defines a tunneling structure 133 forming a quantum well for the holes prior to the contact layer 140 material. In the illustrated embodiment, the absorber layer 120 is fabricated from VLWIR material, and the barrier layer 130 is fabricated from $(GaSb)_x(AlAs_{0.08}Sb_{0.92})_{1-x}$ lattice matched to GaSb, with x value chosen such that the VBO of the first barrier layer 131 is lined up with that of the absorber layer 120. The contact layer 140 is fabricated from $InAs_{0.9107}Sb_{0.0893}$. As shown by lines 102 and 104 in FIG. 7, the VBO is above the CBO at the interface between the second barrier layer 132 and the contact layer 140.

As compared to the embodiment depicted in FIG. 5, the y value is chosen such that the bottom of the quantum well for holes at the tunneling interface is below the Fermi level, whereas in the example of FIG. 5, the bottom of the quantum well for holes at the tunneling interface is above the Fermi level.

It should be understood that the examples provided by FIGS. 3-7 are provided for illustrative purposes only, and that other materials and configurations are also possible to provide the tunneling structures depicted in FIGS. 1 and 2A-2C.

In addition to the above single color (i.e., wavelength) device structures, the TBIRD design structure is also applicable for dual band applications. One example dual-band infrared detector device 801 incorporating a TBIRD structure is illustrated by the band diagram of FIG. 8A. The illustrated dual-band infrared detector device 801 includes a first absorber layer 820 made of a material capable of absorbing radiation in a first wavelength range (e.g., LWIR), a barrier layer 830 comprising a first barrier layer 831 and a second barrier layer 832, and a second absorber layer 840 made of a material capable of absorbing radiation in a second wavelength range (e.g., MWIR). It is noted that the barrier layer 830 may be configured as graded barrier layer as described above rather than a first barrier layer 831 and a second barrier layer 832. The first absorber layer 820 may be fabricated from a LWIR material and the second absorber layer 840 may be fabricated from a MWIR material. The first and second barrier layers 831, 832 may be fabricated from the materials of the first and second barrier layers 131, 132 depicted in FIG. 5, for example.

The valence band of the dual-band infrared detector device 801 is illustrated by line 804, and the conduction band is illustrated by line 802.

Figure 8A:
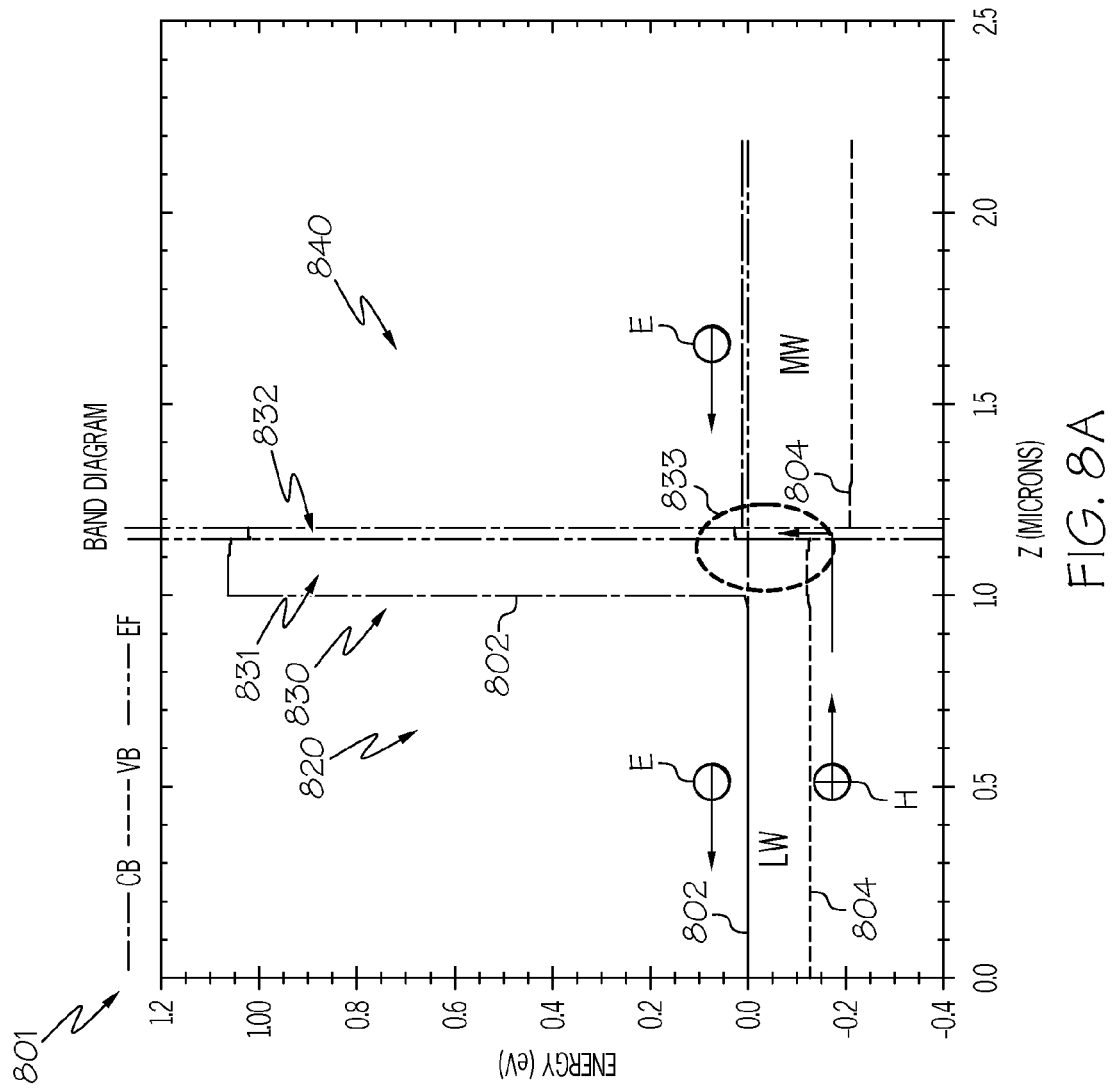
FIG. 8A is a graphic illustration of a band diagram for an example mid-wave/long-wave dual band device having a tunneling structure according to one or more embodiments described and illustrated herein, wherein carrier propagation is illustrated for zero or negative bias direction.
Figure 8B:
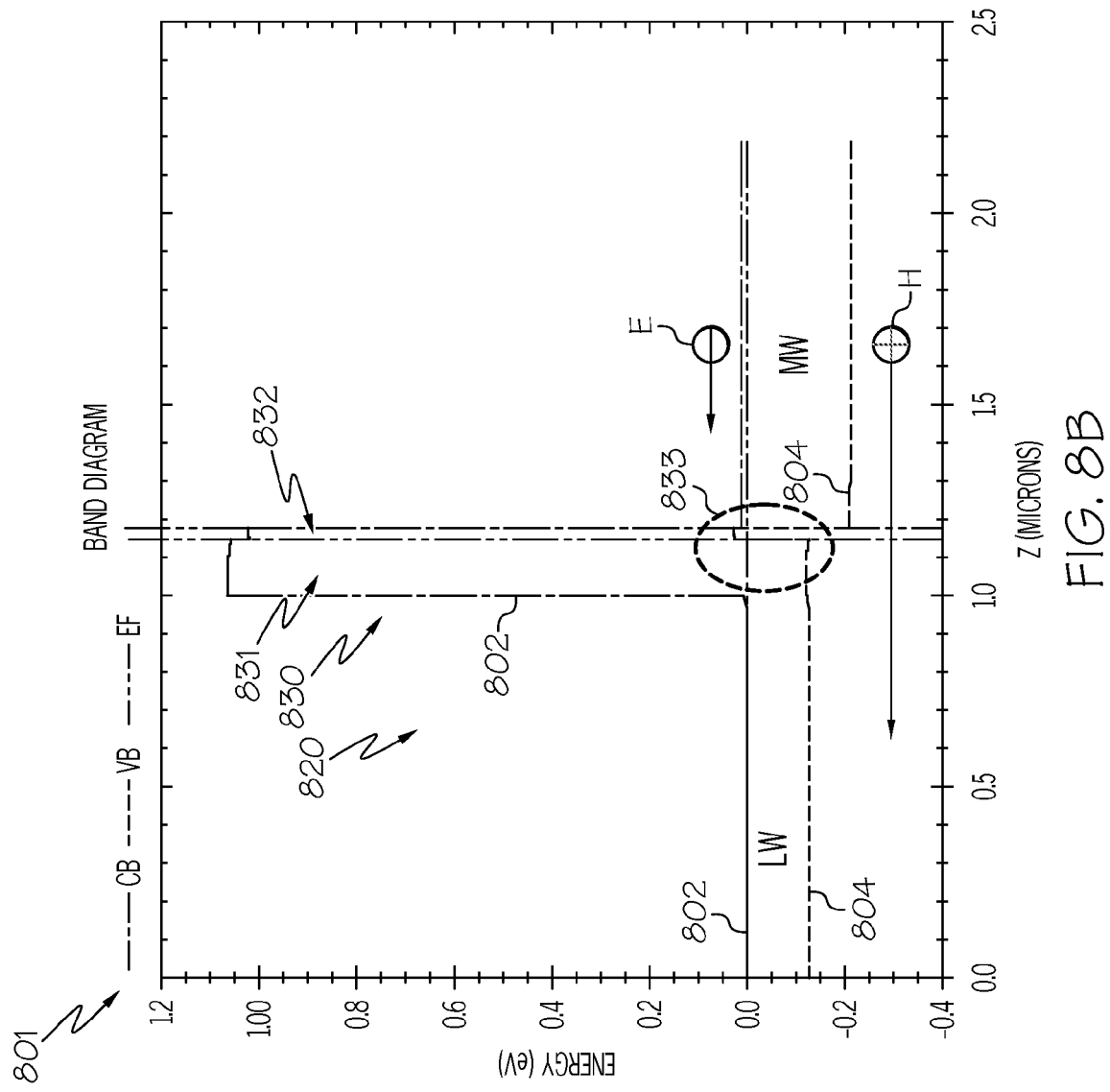
FIG. 8B is a graphic illustration of a band diagram for the example mid-wave/long-wave dual band device depicted in FIG. 8A, wherein carrier propagation is illustrated for positive bias direction.

The tunneling structure 833 features a rectangular hole quantum well design. For illustrative purposes, it is assumed that the bias is designated to be positive if positive voltage is applied to the right side of the device structure illustrated in FIG. 8A (i.e., a contact (not shown) proximate the second absorber layer 840). Under zero or negative bias, the device simulated in FIG. 8A will have long-wave response. The long-wave response will be quenched after certain positive bias when the mid-wave-only response will be present, as illustrated in FIG. 8B.

Another application using the tunneling structure described above is a fast tunneling barrier infrared detector ("Fast TBIRD") device utilizing p-type absorber material. As the minority carrier in a p-type absorber material is electron, the mobility is very high, and the carrier lifetime is also much shorter (thus "fast") than that in an n-type material. Five non-limiting example Fast TBIRD device embodiments are described and illustrated herein.

Figure 9:
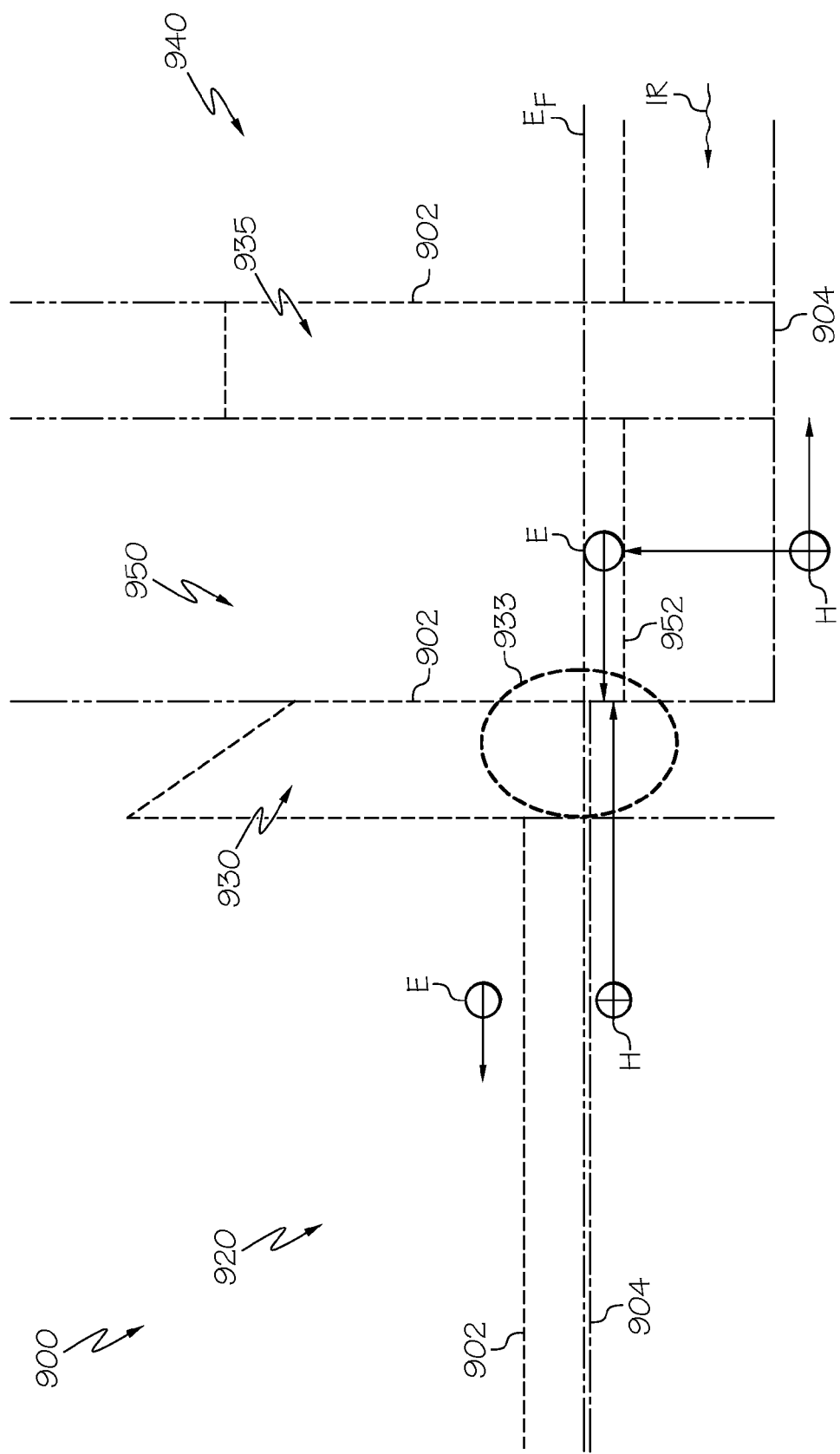
FIG. 9 is a graphic illustration of a band diagram for an example fast tunneling barrier infrared detector ("Fast TBIRD") device having a first barrier layer and a second barrier layer according to one or more embodiments described and illustrated herein.

A first example Fast TBIRD device 900 is illustrated by a band diagram in FIG. 9. The example Fast TBIRD device 900 comprises an absorber layer 920, a first barrier layer 930, which is graded, a n-type layer 950 adjacent to the first barrier layer 930, a second barrier layer 935 adjacent to the n-type layer 950, and a contact layer 940 adjacent to the second barrier layer 935. The bandgap of the n-type layer 950 is larger than the bandgap of the absorber layer 920.

The absorber layer 920 and the first barrier layer 930 are doped p-type. The n-type layer 950 and the contact layer 940 are doped n-type.

The valence band of the Fast TBIRD device 900 is illustrated by line 904, and the conduction band is illustrated by line 902.

When an infrared photon (IR) is absorbed in the smaller bandgap absorber material of the absorber layer 920, an electron (E)-hole (H) pair is generated in the absorber layer 920. As the absorber layer 920 is p-type, electrons are minority carriers. The minority electron E propagates toward the first contact layer (not shown), which in the illustrated embodiment is to the left of the page. The majority hole H propagates toward the first barrier layer 930. There will be an electron-hole exchange at the tunneling junction provided by the tunneling structure 933 between the first barrier layer 930 and the n-type layer 950. Due to the presence of the second barrier layer 935, the majority of electrons from the contact layer 940 cannot propagate to the n-type layer 950 directly. Thermal generation or a shorter wavelength incident photon will enable generation of an electron-hole pair within the n-type layer 950, as shown in FIG. 9. This provides a majority electron E to pass though the tunneling junction as well as a minority hole H to carry out the signal to the contact layer 940. The dark current is dominated by the wide bandgap nBn device structure.

Figure 10:
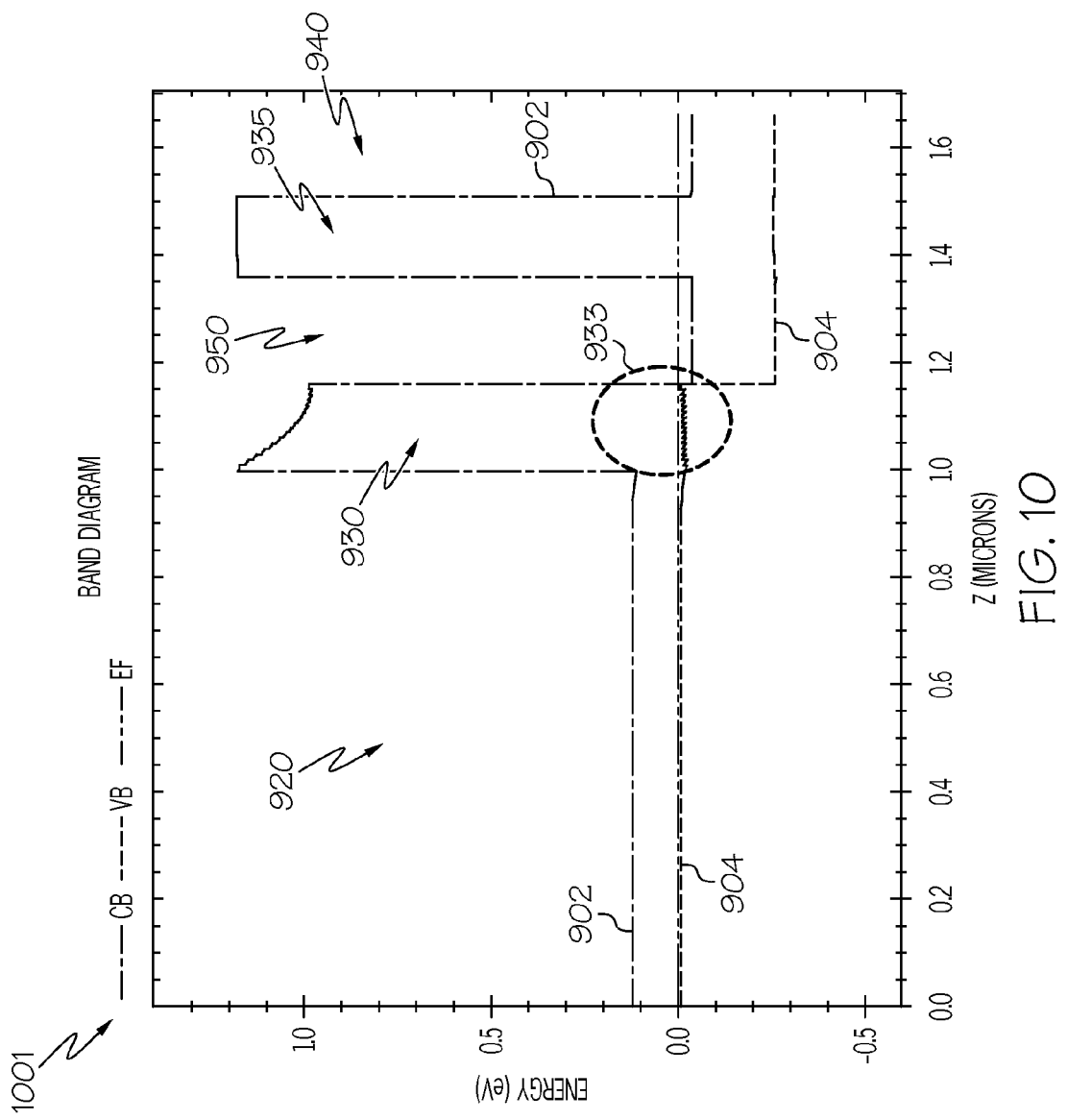
FIG. 10 is a graphic illustration of a band diagram for a simulation of an example Fast TBIRD device as depicted in FIG. 9 wherein the absorber layer is an LWIR material according to one or more embodiments described and illustrated herein.

FIG. 10 depicts a simulation band diagram 1001 of an example embodiment of the Fast TBIRD structure illustrated in FIG. 9. In the simulation, the absorber layer 920 is fabricated from LWIR material that is doped p−. The graded first barrier layer 930 is fabricated from $(GaSb)_x(AlAs_{0.08}Sb_{0.92})_{1-x}$ with linearly graded x values, and is doped p-type to about $5\times10^{16}$ cm$^{-3}$. The n-type layer 950 and the contact layer 940 on both sides of the second barrier layer 932 are fabricated from a MWIR material with a bandgap wider than the absorber that is doped n-type in the MWIR regions to a doping level of about $8\times10^{16}$ cm$^{-3}$. The second barrier layer 935 is fabricated from nominally undoped $(GaSb)_y(AlAs_{0.08}Sb_{0.92})_{1-y}$. As shown in FIG. 10, the graded first barrier layer 930 and the n-type layer 950 provides a tunneling structure 933 that creates a tunneling junction for electron-hole exchange.

Figure 11:
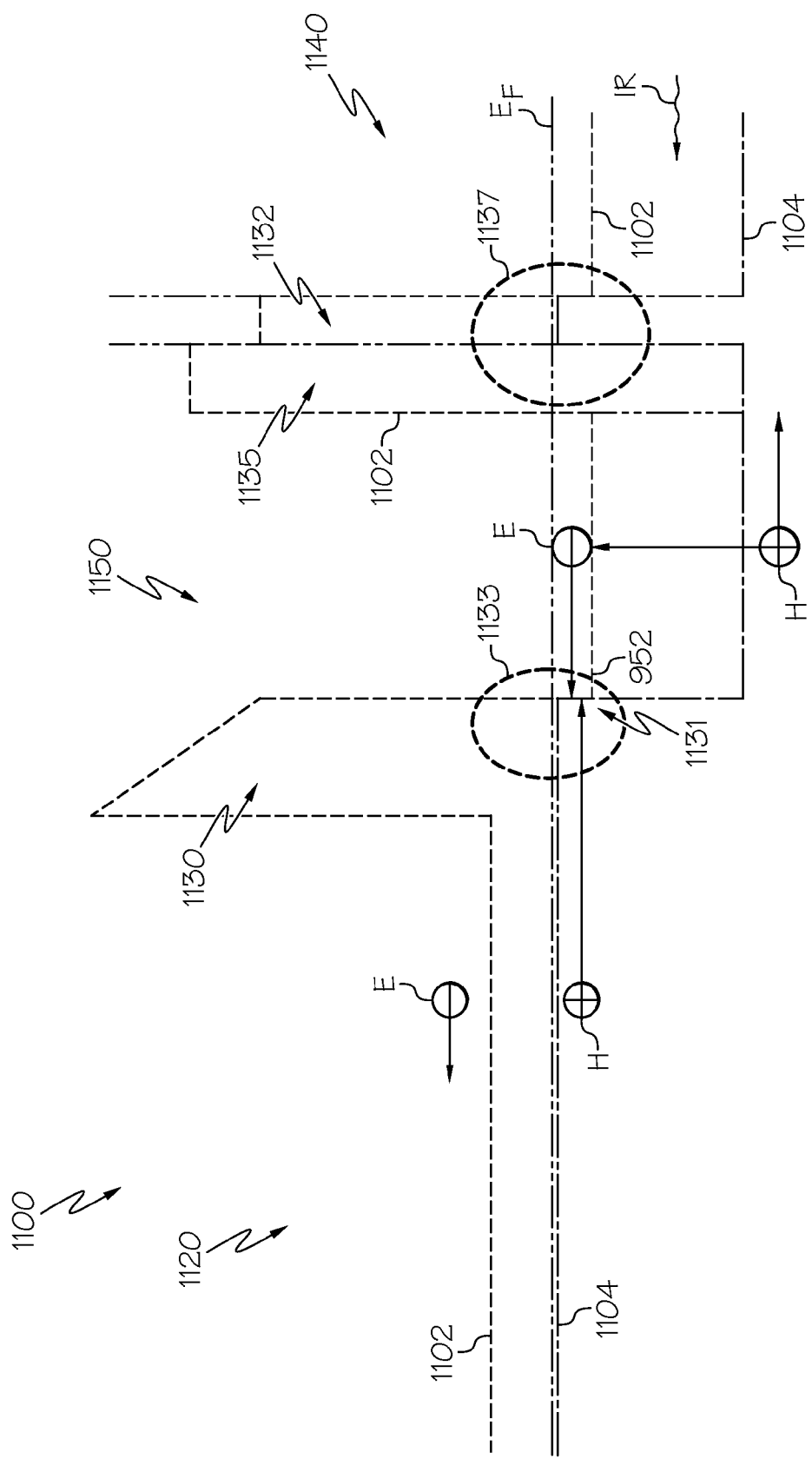
FIG. 11 is a graphic illustration of a band diagram for an example Fast TBIRD device having a first barrier layer and a second barrier layer configured as a TBIRD structure according to one or more embodiments described and illustrated herein.

A second example Fast TBIRD device 1100 is illustrated by a band diagram in FIG. 11. In this embodiment, a TBIRD structure replaces the nBn structure in the Fast TBIRD device 900 illustrated in FIG. 9.

The valence band of the Fast TBIRD device 1100 is illustrated by line 1104, and the conduction band is illustrated by line 1102.

The example Fast TBIRD device 1100 comprises an absorber layer 1120, a first barrier layer 1130, which is graded, an n-type layer 1150 adjacent to the first barrier layer 1130, a second barrier layer 1135 adjacent to the n-type layer 1150, a third barrier layer 1132 adjacent to the second barrier layer 1135, and a contact layer 940 adjacent to the third barrier layer 1132. The bandgap of the n-type layer 1150 is larger than the bandgap of the absorber layer 1120. The first barrier layer 1130 and the n-type layer 1150 form a first tunneling structure 1133.

The materials of the absorber layer 1120, the first barrier layer 1130, the n-type layer 1150, the second barrier layer 1135, and the contact layer 140 may be similar to the materials described above with reference to FIGS. 9 and 10. As a non-limiting example, the third barrier layer 1132 may be $(GaSb)_x(AlAs_{0.08}Sb_{0.92})_{1-x}$ with x value chosen such that there is the broken gap type II band alignment with the contact layer 1140 MWIR material. The third barrier layer 1132 and the second contact layer 140 form a second tunneling structure 1137.

Figure 12:
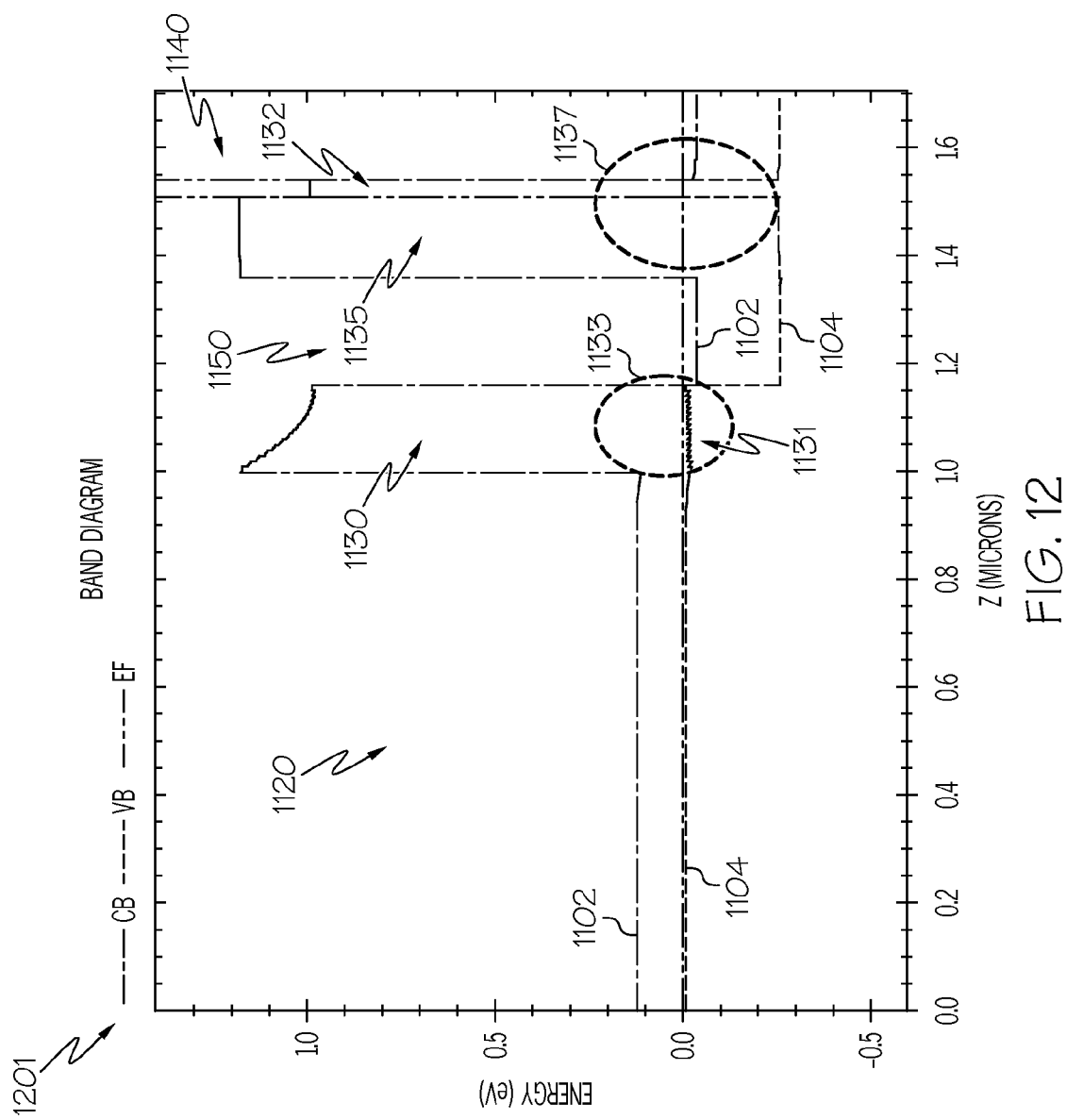
FIG. 12 is a graphic illustration of a band diagram for a simulation of an example Fast TBIRD device as depicted in FIG. 11 according to one or more embodiments described and illustrated herein.

FIG. 12 provides a simulation band diagram 1201 of the Fast TBIRD device 1100 depicted in FIG. 9 using the same materials for the various layers as described above with respect to the simulation of FIG. 10. In the simulation depicted in FIG. 12, the third barrier layer 1132 is fabricated from $(GaSb)_x(AlAs_{0.08}Sb_{0.92})_{1-x}$ that is doped p-type to $2\times10^{17}$ cm$^{-3}$.

Figure 13:
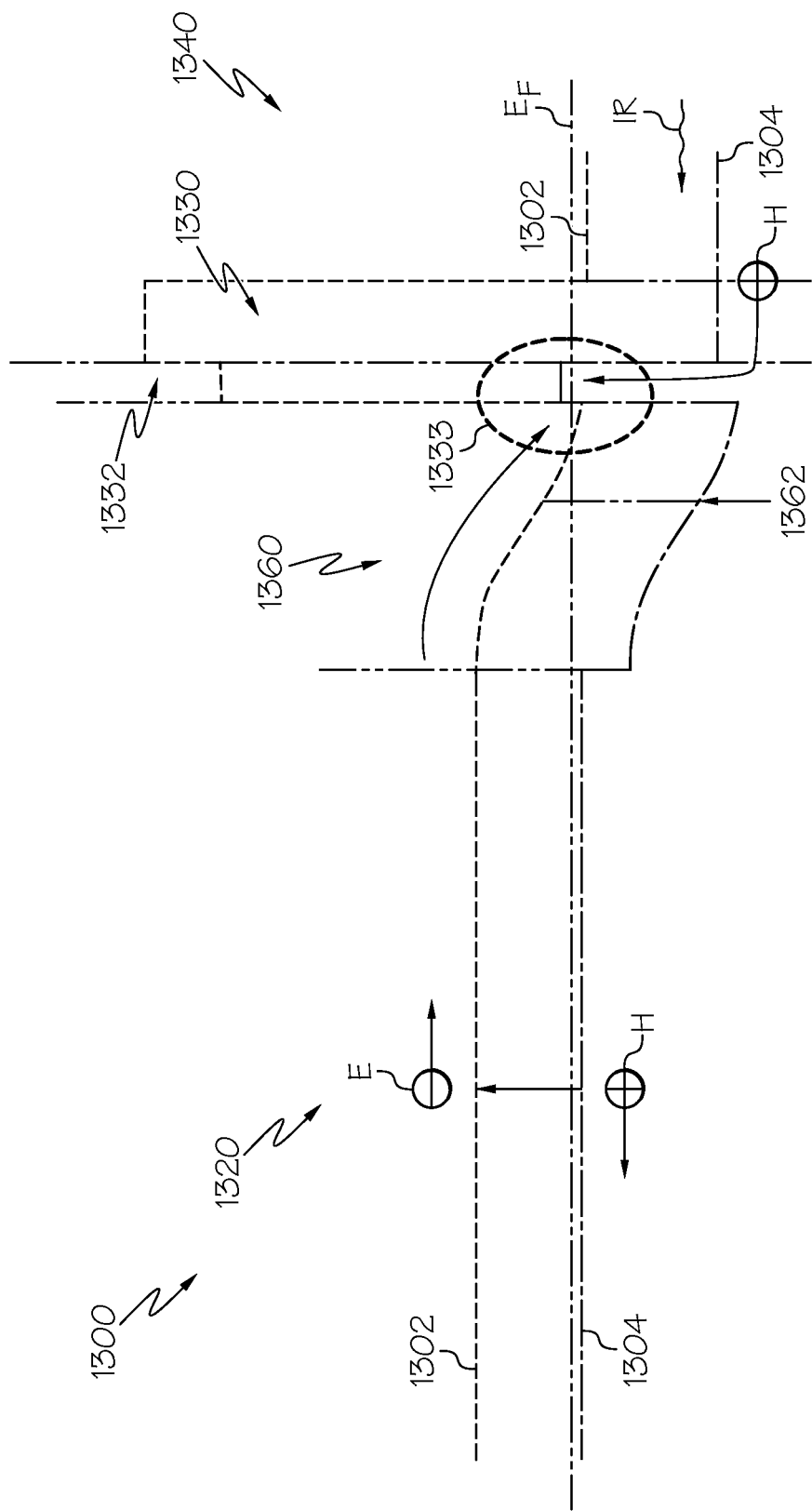
FIG. 13 is a graphic illustration of a band diagram for an example Fast TBIRD device having a single electron barrier with a tunneling structure and a wider-gap p-n junction prior to the tunneling junction according to one or more embodiments described and illustrated herein.

A third example Fast TBIRD device 1300 is illustrated by a band diagram in FIG. 13. In this embodiment, the Fast TBIRD device 1300 comprises an absorber layer 1320, a hole barrier layer 1360 providing a p-n junction 1362, a first barrier layer 1332, a second barrier layer 1330, and a contact layer 1340.

The valence band of the Fast TBIRD device 1300 is illustrated by line 1304, and the conduction band is illustrated by line 1302.

A tunneling structure 1333 is provided by the hole barrier layer 1360 and the first barrier layer 1332.

After one electron E and hole H pair is generated in the p-type absorber layer 1320, the minority electron E will drift toward the wider gap p-n junction within the hole barrier layer 1360, and move down to the lowest available energy states within the electron well formed before the tunneling structure 1333, where the minority electron E will meet and recombine with a hole H from the hole well on the barrier layer 1330 side of the tunneling structure 1333. Charge neutrality requires one extra hole H to flow in from the contact layer 1340 side of the device structure and thus the signal is detected in an external circuit. The device dark current is limited by either the generation-recombination ("GR") current from the wider-gap p-n junction within the hole barrier layer 1360, the diffusion current from the absorber layer 1320, or the diffusion current from the contact layer 1340.

Figure 14:
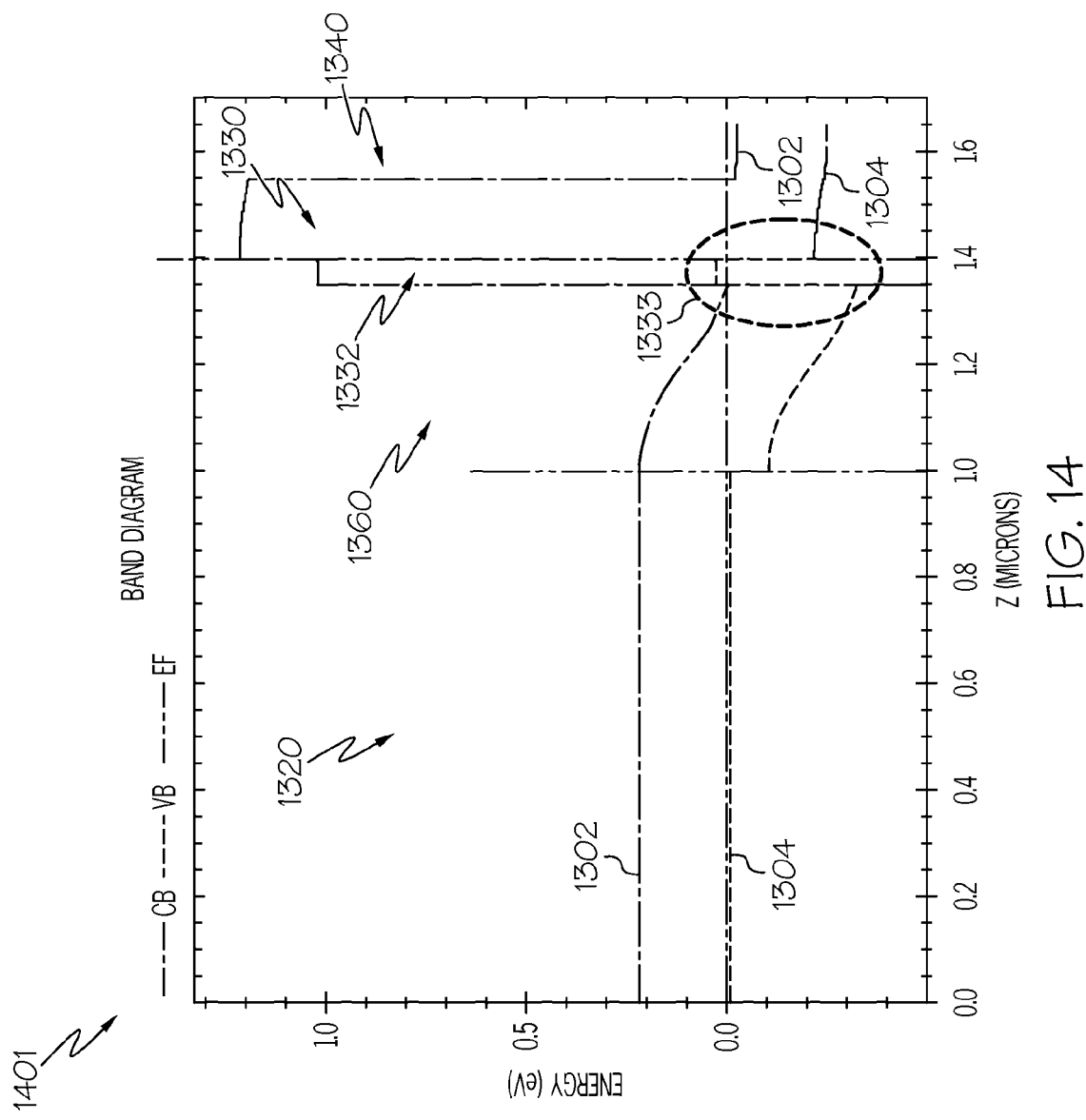
FIG. 14 is a graphic illustration of a band diagram for a simulation of an example Fast TBIRD device as depicted in FIG. 13 according to one or more embodiments described and illustrated herein.

FIG. 14 provides a simulation band diagram 1401 of the Fast TBIRD device 1300 depicted in FIG. 13. The material of the absorber layer 1320 is a doped p− MWIR material. The hole barrier layer 1360 providing the hole barrier of the non-limiting example embodiment is an material with a wider bandgap than that of the absorber layer 1320. In the illustrated simulation, the p and n doping levels within hole barrier layer 1360 forming the p-n junction is in the mid $10^{15}$ cm$^{-3}$ range. The first barrier layer 1332 is formed using $(GaSb)_x(AlAs_{0.08}Sb_{0.92})_{1-x}$ p doped to $3\times10^{18}$ cm$^{-3}$. The following second barrier layer 1330 is formed using $(GaSb)_y(AlAs_{0.08}Sb_{0.92})_{1-y}$ with y>x and a background p-type doping on the order of $10^{15}$ cm$^{-3}$. The contact layer 1340 is formed using the same MWIR material as the absorber layer 1320 with n-type doping chosen to create close-to-flat band alignment for holes with the barrier layer 1330. A tunneling junction is present at the interface between the hole barrier layer 1360 and the barrier layer 1332 such that the VBO of the hole barrier layer 1360 is above the CBO of the first barrier layer 1332.

Figure 15:
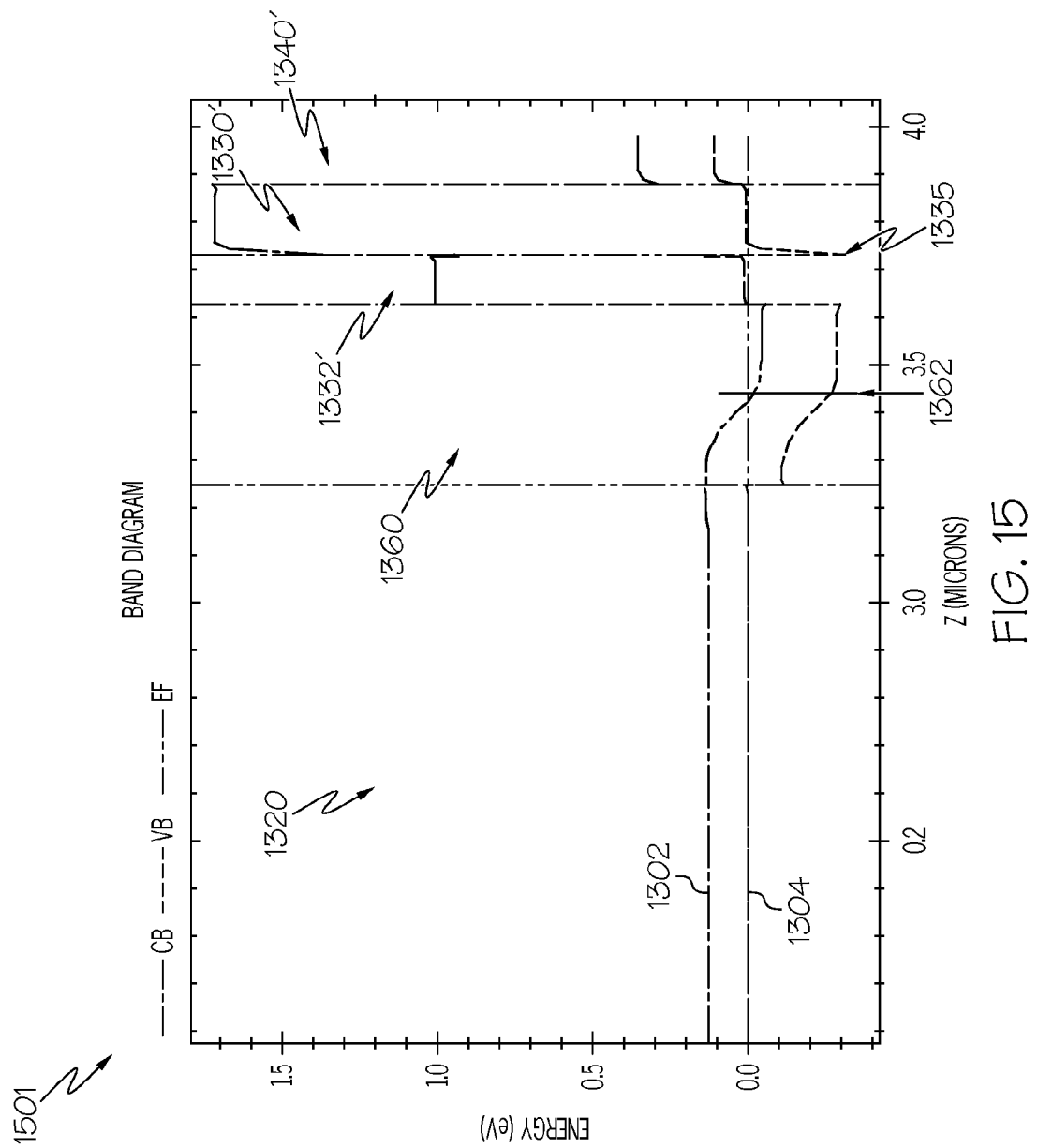
FIG. 15 is a graphic illustration of a band diagram for a simulation of an example Fast TBIRD device derived from the example Fast TBIRD device as depicted in FIG. 13 according to one or more embodiments described and illustrated herein.

A fourth example Fast TBIRD device is illustrated by a simulation band diagram 1501 in FIG. 15. The Fast TBIRD device illustrated in FIG. 15 is a derivative of the Fast TBIRD device 1300 illustrated in FIG. 13. The first barrier layer 1332', the second barrier layer 1330', and the contact layer 1340' are p+ doped. More specifically, the first barrier layer 1332' is $Al_{0.25}Ga_{0.75}As_{0.02}Sb_{0.98}$ doped p+, the barrier layer 1330' is $AlAs_{0.08}Sb_{0.92}$ doped p+. In the illustrated example, the absorber layer 1320' is fabricated from LWIR material, the hole barrier layer 1360' is fabricated from MWIR material, and the contact layer 1340' is fabricated from a same material as layer 1360 except for the p doping.

In this example, there are no true "barriers" except for a spike in the valence band at the interface between the first barrier layer 1332' and the second barrier layer 1330'. At the interior of the device structure, the holes flow through the barrier with little resistance. On the sidewall surface, the Aluminum containing layers will oxidize, and block the current flow. Despite that fact, that the absorber layer 1320 could be inverted to be n-type on the surface, the associated shunt path is blocked by the oxidized Al containing layers. Thus this device structure could resolve the passivation issue for p-type absorber materials.

Figure 16:
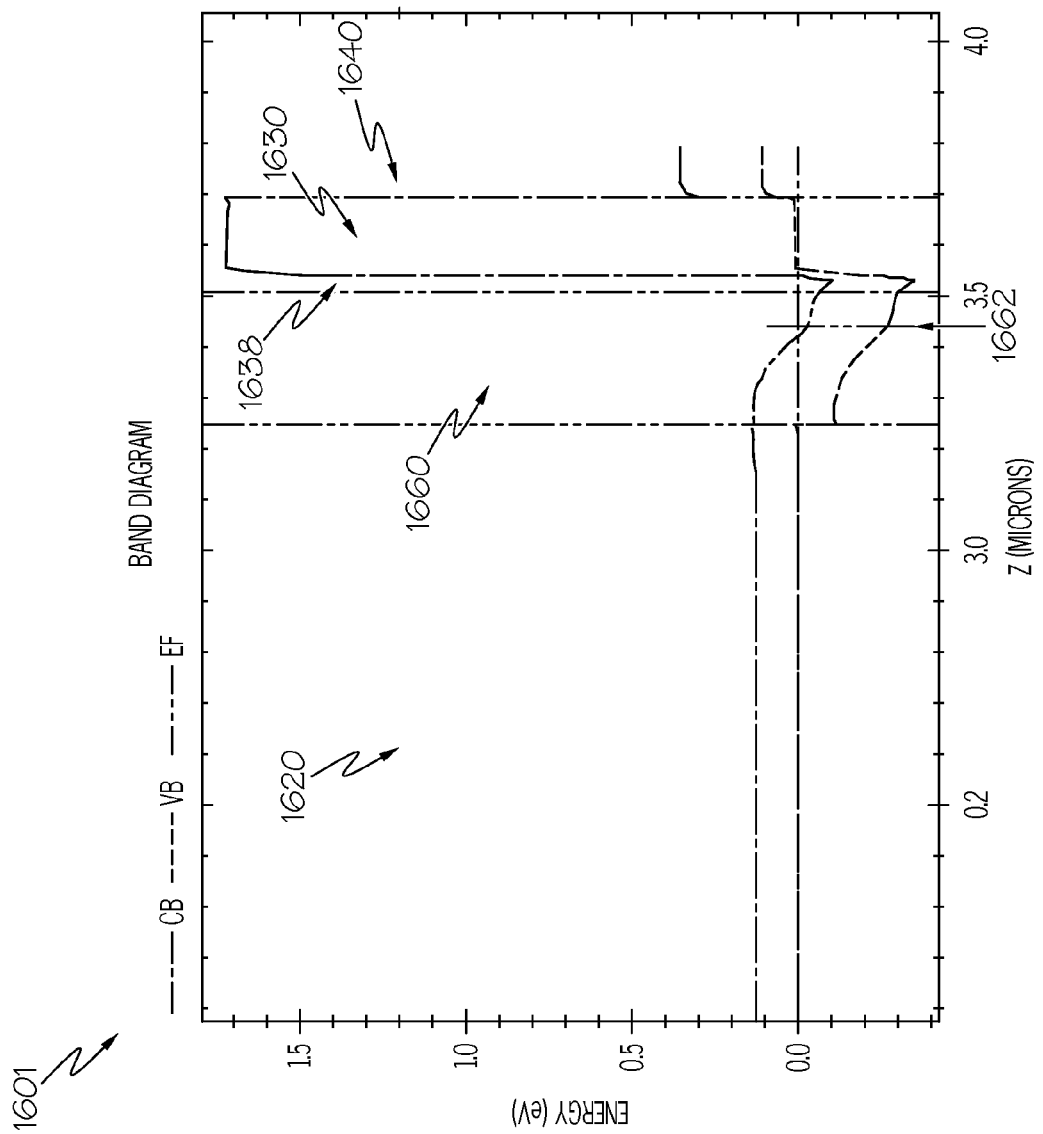
FIG. 16 is a graphical illustration of a band diagram for a simulation of an example Fast TBIRD device derived from the example Fast TBIRD device as depicted in FIG. 13 according to one or more embodiments described and illustrated herein.

A fifth example Fast TBIRD device is illustrated a simulation band diagram 1601 in FIG. 16. This embodiment is a simplification of the device structure illustrated in FIG. 15.

The device comprises an absorber layer 1620, a hole barrier layer 1660, an n++ layer 1638 with a same bandgap as hole barrier layer 1660, a barrier layer 1630, and a contact layer 1640. The first barrier layer 1332 of FIG. 15 is eliminated. Carriers would propagate through the structure via band-to-band tunneling. In order to facilitate the band-to-band tunneling, a thin (e.g., a few to tens of nanometers thick) n++ layer 1638 with a same bandgap of the hole barrier layer 1660 is doped n++ adjacent to the barrier layer 1630. The hole barrier layer 1660 provides a p-n junction 1662. In the illustrated embodiment, the absorber layer 1620 is fabricated from LWIR material, the hole barrier layer 1660 is fabricated from MWIR material, the n++ layer 1638 is fabricated from a same material with hole barrier layer 1660 doped n++, the barrier layer 1630 is fabricated from $AlAs_{0.08}Sb_{092}$ doped p++. and the contact layer 1640 is fabricated from a same material as hole barrier layer 1660 doped p+.

Compared with a pBp device design, the example Fast TBIRD devices described above disclosure would alleviate or completely resolve the surface passivation issues. It should be understood that the embodiments of a Fast TBIRD device are not limited to the examples given in this document. The structure can be modified easily to meet the needs for any specific application.

The foregoing description of the various embodiments of the present disclosure has been presented for the purposes of illustration and description. Many alternatives, modifications and variations will be apparent to those skilled in the art of the above teaching. Moreover, although multiple aspects have been presented, such aspects need not be utilized in combination, and various combinations of aspects are possible in light of the various embodiments provided above. Accordingly, the above description is intended to embrace all possible alternatives, modifications, combinations, and variations that have been discussed or suggested herein, as well as all others that fall with the principles, spirit and broad scope of the subject matter as defined by the claims.

What is claimed is:

1. An infrared detector device comprising:
    a first contact layer;
    an absorber layer adjacent to the first contact layer; and
    a tunneling structure comprising a barrier layer adjacent to the absorber layer and a second contact layer adjacent to the barrier layer, wherein the barrier layer has a tailored valence band offset such that:
        a valence band offset of the barrier layer at the interface between the absorber layer and the barrier layer is substantially aligned with the valence band offset of the absorber layer; and
        the valence band offset of the barrier layer at the interface between the barrier layer and the second contact layer is above a conduction band offset that is within the second contact layer.

2. The infrared detector device of claim 1, wherein:
    the barrier layer comprises a first barrier layer and a second barrier layer;
    the first barrier layer is adjacent to the absorber layer; and
    the second barrier layer is adjacent to the second contact layer.

3. The infrared detector device of claim 2, wherein:
    the first barrier layer comprises $(GaSb)_x(AlAs_{0.08}Sb_{0.92})_{1-x}$ lattice matched to GaSb, with x value chosen such that a valence band offset of the first barrier layer is substantially-aligned with a valence band offset of the absorber layer; and
    the second barrier layer comprises $(GaSb)_y(AlAs_{0.08}Sb_{0.92})_{1-y}$, where y>x.

4. The infrared detector device of claim 3, wherein a base energy level of a quantum well for holes formed by the tunneling structure is greater than the Fermi level.

5. The infrared detector device of claim 3, wherein a base energy level of a quantum well for holes formed by the tunneling structure is less than the Fermi level.

6. The infrared detector device of claim 1, wherein the tunneling structure provides a gradual transition from the valence band offset at the interface between the barrier layer and the absorber layer to the valence band offset at the interface between the barrier layer and the second contact layer.

7. The infrared detector device of claim 1, wherein a transition from the valence band offset at the interface between the barrier layer and the absorber layer to the valence band offset at the interface between the barrier layer and the second contact layer is parabolic.

8. The infrared detector device of claim 1, wherein a transition from the valence band offset at the interface between the barrier layer and the absorber layer to the valence band offset at the interface between the barrier layer and the second contact layer is rectangular.

9. The infrared detector device of claim 1, wherein the absorber layer comprises an InAs/InAsSb SLS, InAs/Ga(In)Sb SLS, a digital alloy, or bulk absorber.

10. The infrared detector device of claim 1, wherein the barrier layer comprises a graded $(GaSb)_x(AlAsSb)_{1-x}$ structure.

11. The infrared detector device of claim 1, wherein the barrier layer comprises a graded superlattice material.

12. The infrared detector device of claim 11, wherein the graded superlattice material comprises a AlAsSb/GaSb superlattice structure.

* * * * *